US011063476B2

(12) United States Patent
Hosseini et al.

(10) Patent No.: US 11,063,476 B2
(45) Date of Patent: *Jul. 13, 2021

(54) MICROSTRIP ANTENNAS FOR WIRELESS POWER TRANSMITTERS

(71) Applicant: Energous Corporation, San Jose, CA (US)

(72) Inventors: Alister Hosseini, Phoenix, AZ (US); Saman Kabiri, Aliso Viejo, CA (US); Evangelos Kornaros, Santa Cruz, CA (US); Michael A. Leabman, San Ramon, CA (US)

(73) Assignee: Energous Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/596,615

(22) Filed: Oct. 8, 2019

(65) Prior Publication Data
US 2020/0112204 A1 Apr. 9, 2020

Related U.S. Application Data

(63) Continuation of application No. 15/414,464, filed on Jan. 24, 2017, now Pat. No. 10,439,442.

(51) Int. Cl.
H02J 50/23 (2016.01)
H01Q 1/02 (2006.01)
(Continued)

(52) U.S. Cl.
CPC ............ H02J 50/23 (2016.02); H01Q 1/48 (2013.01); H01Q 9/0407 (2013.01);
(Continued)

(58) Field of Classification Search
CPC ................... H01Q 1/2283; H01Q 1/38
See application file for complete search history.

(56) References Cited

U.S. PATENT DOCUMENTS 787,412 A 4/1905 Tesla
2,811,624 A 10/1957 Haagensen
(Continued)

FOREIGN PATENT DOCUMENTS

CN 201278367 Y 7/2009
CN 102292896 A 12/2011
(Continued)

OTHER PUBLICATIONS

Energous Corp., ISRWO, PCT/US2014/037072, Sep. 12, 2014, 8 pgs.
(Continued)

Primary Examiner — Rexford N Barnie
Assistant Examiner — Elim Ortiz
(74) Attorney, Agent, or Firm — Morgan, Lewis & Bockius LLP

(57) ABSTRACT

A microstrip antenna for use in a wireless power transmission system and a method for forming the microstrip antenna are described. The antenna includes a first multi-layer printed circuit board (PCB) that includes a top surface and a bottom surface. The top and bottom surfaces of the first multi-layer PCB include a first electrically conductive material. The antenna includes a second multi-layer PCB that includes a top surface and a bottom surface. The top and bottom surfaces of the second multi-layer PCT include a second electrically conductive material. A first plurality of vias each substantially pass through the top and bottom surfaces of the first multi-layer PCB. A second plurality of vias each substantially pass through the top and bottom surfaces of the second multi-layer PCB. The antenna further comprises a dielectric slab that is configured to receive the first multi-layer PCB and the second multi-layer PCB.

18 Claims, 9 Drawing Sheets

(51) Int. Cl.
  *H05K 1/02* (2006.01)
  *H05K 3/30* (2006.01)
  *H05K 3/46* (2006.01)
  *H05K 1/11* (2006.01)
  *H01Q 1/48* (2006.01)
  *H01Q 9/04* (2006.01)

(52) U.S. Cl.
  CPC ......... *H05K 1/0203* (2013.01); *H05K 1/0237* (2013.01); *H05K 1/115* (2013.01); *H05K 3/30* (2013.01); *H05K 3/4644* (2013.01); *H05K 2201/10098* (2013.01)

(56) References Cited

U.S. PATENT DOCUMENTS

| | | | |
|---|---|---|---|
| 2,863,148 | A | 12/1958 | Gammon et al. |
| 3,167,775 | A | 1/1965 | Guertler |
| 3,434,678 | A | 3/1969 | Brown et al. |
| 3,696,384 | A | 10/1972 | Lester |
| 3,754,269 | A | 8/1973 | Clavin |
| 4,101,895 | A | 7/1978 | Jones, Jr. |
| 4,360,741 | A | 11/1982 | Fitzsimmons et al. |
| 4,944,036 | A | 7/1990 | Hyatt |
| 4,995,010 | A | 2/1991 | Knight |
| 5,200,759 | A | 4/1993 | McGinnis |
| 5,211,471 | A | 5/1993 | Rohrs |
| 5,548,292 | A | 8/1996 | Hirshfield et al. |
| 5,556,749 | A | 9/1996 | Mitsuhashi et al. |
| 5,568,088 | A | 10/1996 | Dent et al. |
| 5,646,633 | A | 7/1997 | Dahlberg |
| 5,697,063 | A | 12/1997 | Kishigami et al. |
| 5,712,642 | A | 1/1998 | Hulderman |
| 5,936,527 | A | 8/1999 | Isaacman et al. |
| 5,982,139 | A | 11/1999 | Parise |
| 6,046,708 | A | 4/2000 | MacDonald, Jr. et al. |
| 6,061,025 | A | 5/2000 | Jackson et al. |
| 6,127,799 | A | 10/2000 | Krishnan |
| 6,127,942 | A | 10/2000 | Welle |
| 6,163,296 | A | 12/2000 | Lier et al. |
| 6,271,799 | B1 * | 8/2001 | Rief .................. H01Q 13/0258 343/776 |
| 6,289,237 | B1 | 9/2001 | Mickle et al. |
| 6,329,908 | B1 | 12/2001 | Frecska |
| 6,400,586 | B2 | 6/2002 | Raddi et al. |
| 6,421,235 | B2 | 7/2002 | Ditzik |
| 6,437,685 | B2 | 8/2002 | Hanaki |
| 6,456,253 | B1 | 9/2002 | Rummeli et al. |
| 6,476,795 | B1 | 11/2002 | Derocher et al. |
| 6,501,414 | B2 | 12/2002 | Arndt et al. |
| 6,583,723 | B2 | 6/2003 | Watanabe et al. |
| 6,597,897 | B2 | 7/2003 | Tang |
| 6,615,074 | B2 | 9/2003 | Mickle et al. |
| 6,650,376 | B1 | 11/2003 | Obitsu |
| 6,664,920 | B1 | 12/2003 | Mott et al. |
| 6,680,700 | B2 | 1/2004 | Hilgers |
| 6,798,716 | B1 | 9/2004 | Charych |
| 6,803,744 | B1 | 10/2004 | Sabo |
| 6,853,197 | B1 | 2/2005 | McFarland |
| 6,856,291 | B2 | 2/2005 | Mickle et al. |
| 6,911,945 | B2 | 6/2005 | Korva |
| 6,960,968 | B2 | 11/2005 | Odendaal et al. |
| 6,967,462 | B1 | 11/2005 | Landis |
| 6,988,026 | B2 | 1/2006 | Breed et al. |
| 7,003,350 | B2 | 2/2006 | Denker et al. |
| 7,027,311 | B2 | 4/2006 | Vanderelli et al. |
| 7,068,234 | B2 | 6/2006 | Sievenpiper |
| 7,068,991 | B2 | 6/2006 | Parise |
| 7,079,079 | B2 * | 7/2006 | Jo .................. H01Q 1/243 343/700 MS |
| 7,183,748 | B1 | 2/2007 | Unno et al. |
| 7,191,013 | B1 | 3/2007 | Miranda et al. |
| 7,193,644 | B2 | 3/2007 | Carter |
| 7,196,663 | B2 | 3/2007 | Bolzer et al. |
| 7,205,749 | B2 | 4/2007 | Hagen et al. |
| 7,215,296 | B2 | 5/2007 | Abramov et al. |
| 7,222,356 | B1 | 5/2007 | Yonezawa et al. |
| 7,274,334 | B2 | 9/2007 | o'Riordan et al. |
| 7,274,336 | B2 | 9/2007 | Carson |
| 7,351,975 | B2 | 4/2008 | Brady et al. |
| 7,359,730 | B2 | 4/2008 | Dennis et al. |
| 7,372,408 | B2 * | 5/2008 | Gaucher .................. H01Q 23/00 343/700 MS |
| 7,392,068 | B2 | 6/2008 | Dayan |
| 7,403,803 | B2 | 7/2008 | Mickle et al. |
| 7,443,057 | B2 | 10/2008 | Nunally |
| 7,451,839 | B2 | 11/2008 | Perlman |
| 7,463,201 | B2 | 12/2008 | Chiang et al. |
| 7,471,247 | B2 | 12/2008 | Saily |
| 7,535,195 | B1 | 5/2009 | Horovitz et al. |
| 7,564,411 | B2 | 7/2009 | Piisila et al. |
| 7,614,556 | B2 | 11/2009 | Overhultz et al. |
| 7,639,994 | B2 | 12/2009 | Greene et al. |
| 7,643,312 | B2 | 1/2010 | Vanderelli et al. |
| 7,652,577 | B1 | 1/2010 | Madhow et al. |
| 7,679,576 | B2 | 3/2010 | Riedel et al. |
| 7,702,771 | B2 | 4/2010 | Ewing et al. |
| 7,786,419 | B2 | 8/2010 | Hyde et al. |
| 7,812,771 | B2 | 10/2010 | Greene et al. |
| 7,830,312 | B2 | 11/2010 | Choudhury et al. |
| 7,844,306 | B2 | 11/2010 | Shearer et al. |
| 7,868,482 | B2 | 1/2011 | Greene et al. |
| 7,898,105 | B2 | 3/2011 | Greene et al. |
| 7,904,117 | B2 | 3/2011 | Doan et al. |
| 7,911,386 | B1 | 3/2011 | Ito et al. |
| 7,925,308 | B2 | 4/2011 | Greene et al. |
| 7,948,208 | B2 | 5/2011 | Partovi et al. |
| 8,049,676 | B2 | 11/2011 | Yoon et al. |
| 8,055,003 | B2 | 11/2011 | Mittleman et al. |
| 8,070,595 | B2 | 12/2011 | Alderucci et al. |
| 8,072,380 | B2 | 12/2011 | Crouch |
| 8,092,301 | B2 | 1/2012 | Alderucci et al. |
| 8,099,140 | B2 | 1/2012 | Arai |
| 8,115,448 | B2 | 2/2012 | John |
| 8,159,090 | B2 | 4/2012 | Greene et al. |
| 8,159,364 | B2 | 4/2012 | Zeine |
| 8,180,286 | B2 | 5/2012 | Yamasuge |
| 8,228,194 | B2 | 7/2012 | Mickle |
| 8,234,509 | B2 | 7/2012 | Gioscia et al. |
| 8,264,101 | B2 | 9/2012 | Hyde et al. |
| 8,264,291 | B2 | 9/2012 | Morita |
| 8,276,325 | B2 | 10/2012 | Clifton et al. |
| 8,278,784 | B2 | 10/2012 | Cook et al. |
| 8,284,101 | B2 | 10/2012 | Fusco |
| 8,310,201 | B1 | 11/2012 | Wright |
| 8,338,991 | B2 | 12/2012 | Von Novak et al. |
| 8,362,745 | B2 | 1/2013 | Tinaphong |
| 8,380,255 | B2 | 2/2013 | Shearer et al. |
| 8,384,600 | B2 | 2/2013 | Huang et al. |
| 8,410,953 | B2 | 4/2013 | Zeine |
| 8,411,963 | B2 | 4/2013 | Luff |
| 8,432,062 | B2 | 4/2013 | Greene et al. |
| 8,432,071 | B2 | 4/2013 | Huang et al. |
| 8,446,248 | B2 | 5/2013 | Zeine |
| 8,447,234 | B2 | 5/2013 | Cook et al. |
| 8,451,189 | B1 | 5/2013 | Fluhler |
| 8,452,235 | B2 | 5/2013 | Kirby et al. |
| 8,457,656 | B2 | 6/2013 | Perkins et al. |
| 8,461,817 | B2 | 6/2013 | Martin et al. |
| 8,467,733 | B2 | 6/2013 | Leabman |
| 8,497,601 | B2 | 7/2013 | Hall et al. |
| 8,497,658 | B2 | 7/2013 | Von Novak et al. |
| 8,552,597 | B2 | 8/2013 | Song et al. |
| 8,558,661 | B2 | 10/2013 | Zeine |
| 8,560,026 | B2 | 10/2013 | Chanterac |
| 8,564,485 | B2 | 10/2013 | Milosavljevic et al. |
| 8,604,746 | B2 | 12/2013 | Lee |
| 8,614,643 | B2 | 12/2013 | Leabman |
| 8,621,245 | B2 | 12/2013 | Shearer et al. |
| 8,626,249 | B2 | 1/2014 | Kuusilinna et al. |
| 8,629,576 | B2 | 1/2014 | Levine |
| 8,653,966 | B2 | 2/2014 | Rao et al. |
| 8,674,551 | B2 | 3/2014 | Low et al. |
| 8,686,685 | B2 | 4/2014 | Moshfeghi |

(56) References Cited

U.S. PATENT DOCUMENTS

| | | |
|---|---|---|
| 8,686,905 B2 | 4/2014 | Shtrom |
| 8,712,355 B2 | 4/2014 | Black et al. |
| 8,712,485 B2 | 4/2014 | Tam |
| 8,718,773 B2 | 5/2014 | Wills et al. |
| 8,729,737 B2 | 5/2014 | Schatz et al. |
| 8,736,228 B1 | 5/2014 | Freed et al. |
| 8,760,113 B2 | 6/2014 | Keating |
| 8,770,482 B2 | 7/2014 | Ackermann et al. |
| 8,772,960 B2 | 7/2014 | Yoshida |
| 8,823,319 B2 | 9/2014 | Von Novak, III et al. |
| 8,832,646 B1 | 9/2014 | Wendling |
| 8,854,176 B2 | 10/2014 | Zeine |
| 8,860,364 B2 | 10/2014 | Low et al. |
| 8,897,770 B1 | 11/2014 | Frolov et al. |
| 8,903,456 B2 | 12/2014 | Chu et al. |
| 8,917,057 B2 | 12/2014 | Hui |
| 8,923,189 B2 | 12/2014 | Leabman |
| 8,928,544 B2 | 1/2015 | Massie et al. |
| 8,937,408 B2 | 1/2015 | Ganem et al. |
| 8,946,940 B2 | 2/2015 | Kim et al. |
| 8,963,486 B2 | 2/2015 | Kirby et al. |
| 8,970,070 B2 | 3/2015 | Sada et al. |
| 8,989,053 B1 | 3/2015 | Skaaksrud et al. |
| 9,000,616 B2 | 4/2015 | Greene et al. |
| 9,001,622 B2 | 4/2015 | Perry |
| 9,006,934 B2 | 4/2015 | Kozakai et al. |
| 9,021,277 B2 | 4/2015 | Shearer et al. |
| 9,030,161 B2 | 5/2015 | Lu et al. |
| 9,059,598 B2 | 6/2015 | Kang et al. |
| 9,059,599 B2 | 6/2015 | Won et al. |
| 9,077,188 B2 | 7/2015 | Moshfeghi |
| 9,083,595 B2 | 7/2015 | Rakib et al. |
| 9,088,216 B2 | 7/2015 | Garrity et al. |
| 9,124,125 B2 | 9/2015 | Leabman et al. |
| 9,130,397 B2 | 9/2015 | Leabman et al. |
| 9,130,602 B2 | 9/2015 | Cook |
| 9,142,998 B2 | 9/2015 | Yu et al. |
| 9,143,000 B2 | 9/2015 | Leabman et al. |
| 9,143,010 B2 | 9/2015 | Urano |
| 9,153,074 B2 | 10/2015 | Zhou et al. |
| 9,178,389 B2 | 11/2015 | Hwang |
| 9,225,196 B2 | 12/2015 | Huang et al. |
| 9,240,469 B2 | 1/2016 | Sun et al. |
| 9,242,411 B2 | 1/2016 | Kritchman et al. |
| 9,244,500 B2 | 1/2016 | Cain et al. |
| 9,252,628 B2 | 2/2016 | Leabman et al. |
| 9,270,344 B2 | 2/2016 | Rosenberg |
| 9,276,329 B2 | 3/2016 | Jones et al. |
| 9,282,582 B1 | 3/2016 | Dunsbergen et al. |
| 9,294,840 B1 | 3/2016 | Anderson et al. |
| 9,297,896 B1 | 3/2016 | Andrews |
| 9,318,898 B2 | 4/2016 | John |
| 9,368,020 B1 | 6/2016 | Bell et al. |
| 9,401,977 B1 | 7/2016 | Gaw |
| 9,409,490 B2 | 8/2016 | Kawashima |
| 9,419,335 B2 | 8/2016 | Pintos |
| 9,438,045 B1 | 9/2016 | Leabman |
| 9,438,046 B1 | 9/2016 | Leabman |
| 9,444,283 B2 | 9/2016 | Son et al. |
| 9,450,449 B1 | 9/2016 | Leabman et al. |
| 9,461,502 B2 | 10/2016 | Lee et al. |
| 9,520,725 B2 | 12/2016 | Masaoka et al. |
| 9,520,748 B2 | 12/2016 | Hyde et al. |
| 9,522,270 B2 | 12/2016 | Perryman et al. |
| 9,537,354 B2 | 1/2017 | Bell et al. |
| 9,537,357 B2 | 1/2017 | Leabman |
| 9,537,358 B2 | 1/2017 | Leabman |
| 9,538,382 B2 | 1/2017 | Bell et al. |
| 9,544,640 B2 | 1/2017 | Lau |
| 9,559,553 B2 | 1/2017 | Bae |
| 9,564,773 B2 | 2/2017 | Pogorelik et al. |
| 9,571,974 B2 | 2/2017 | Choi et al. |
| 9,590,317 B2 | 3/2017 | Zimmerman et al. |
| 9,590,444 B2 | 3/2017 | Walley |
| 9,620,996 B2 | 4/2017 | Zeine |
| 9,647,328 B2 | 5/2017 | Dobric |
| 9,706,137 B2 | 7/2017 | Scanlon et al. |
| 9,711,999 B2 | 7/2017 | Hietala et al. |
| 9,723,635 B2 | 8/2017 | Nambord et al. |
| 9,793,758 B2 | 10/2017 | Leabman |
| 9,793,764 B2 | 10/2017 | Perry |
| 9,800,172 B1 | 10/2017 | Leabman |
| 9,806,564 B2 | 10/2017 | Leabman |
| 9,819,230 B2 | 11/2017 | Petras et al. |
| 9,825,674 B1 | 11/2017 | Leabman |
| 9,843,229 B2 | 12/2017 | Leabman |
| 9,847,669 B2 | 12/2017 | Leabman |
| 9,847,677 B1 | 12/2017 | Leabman |
| 9,853,361 B2 | 12/2017 | Chen et al. |
| 9,853,485 B2 | 12/2017 | Contopanagos |
| 9,853,692 B1 | 12/2017 | Bell et al. |
| 9,859,758 B1 | 1/2018 | Leabman |
| 9,866,279 B2 | 1/2018 | Bell et al. |
| 9,867,032 B2 | 1/2018 | Verma et al. |
| 9,871,301 B2 | 1/2018 | Contopanagos |
| 9,876,380 B1 | 1/2018 | Leabman et al. |
| 9,876,394 B1 | 1/2018 | Leabman |
| 9,876,536 B1 | 1/2018 | Bell et al. |
| 9,882,394 B1 | 1/2018 | Bell et al. |
| 9,887,584 B1 | 2/2018 | Bell et al. |
| 9,893,555 B1 | 2/2018 | Leabman et al. |
| 9,893,564 B2 | 2/2018 | de Rochemont |
| 9,899,744 B1 | 2/2018 | Contopanagos et al. |
| 9,899,844 B1 | 2/2018 | Bell et al. |
| 9,899,861 B1 | 2/2018 | Leabman et al. |
| 9,916,485 B1 | 3/2018 | Lilly et al. |
| 9,917,477 B1 | 3/2018 | Bell et al. |
| 9,923,386 B1 | 3/2018 | Leabman et al. |
| 9,939,864 B1 | 4/2018 | Bell et al. |
| 9,965,009 B1 | 5/2018 | Bell et al. |
| 9,966,765 B1 | 5/2018 | Leabman |
| 9,966,784 B2 | 5/2018 | Leabman |
| 9,967,743 B1 | 5/2018 | Bell et al. |
| 9,973,008 B1 | 5/2018 | Leabman |
| 10,003,211 B1 | 6/2018 | Leabman et al. |
| 10,014,728 B1 | 7/2018 | Leabman |
| 10,027,159 B2 | 7/2018 | Hosseini |
| 10,038,337 B1 | 7/2018 | Leabman et al. |
| 10,050,462 B1 | 8/2018 | Leabman et al. |
| 10,056,782 B1 | 8/2018 | Leabman |
| 10,063,064 B1 | 8/2018 | Bell et al. |
| 10,068,703 B1 | 9/2018 | Contopanagos |
| 10,075,008 B1 | 9/2018 | Bell et al. |
| 10,079,515 B2 | 9/2018 | Hosseini et al. |
| 10,090,699 B1 | 10/2018 | Leabman |
| 10,090,886 B1 | 10/2018 | Bell et al. |
| 10,103,552 B1 | 10/2018 | Leabman et al. |
| 10,116,162 B2 | 10/2018 | Hosseini et al. |
| 10,122,219 B1 | 11/2018 | Hosseini et al. |
| 10,124,754 B1 | 11/2018 | Leabman |
| 10,128,686 B1 | 11/2018 | Leabman et al. |
| 10,134,260 B1 | 11/2018 | Bell et al. |
| 10,135,112 B1 | 11/2018 | Hosseini |
| 10,135,286 B2 | 11/2018 | Hosseini et al. |
| 10,135,294 B1 | 11/2018 | Leabman |
| 10,141,771 B1 | 11/2018 | Hosseini et al. |
| 10,148,097 B1 | 12/2018 | Leabman et al. |
| 10,153,645 B1 | 12/2018 | Bell et al. |
| 10,153,653 B1 | 12/2018 | Bell et al. |
| 10,153,660 B1 | 12/2018 | Leabman et al. |
| 10,158,257 B2 | 12/2018 | Leabman |
| 10,158,259 B1 | 12/2018 | Leabman |
| 10,164,478 B2 | 12/2018 | Leabman |
| 10,170,917 B1 | 1/2019 | Bell et al. |
| 10,177,594 B2 | 1/2019 | Contopanagos |
| 10,181,756 B2 | 1/2019 | Bae et al. |
| 10,186,892 B2 | 1/2019 | Hosseini et al. |
| 10,193,396 B1 | 1/2019 | Bell et al. |
| 10,199,835 B2 | 2/2019 | Bell |
| 10,199,849 B1 | 2/2019 | Bell |
| 10,205,239 B1 | 2/2019 | Contopanagos et al. |
| 10,211,674 B1 | 2/2019 | Leabman et al. |
| 10,218,227 B2 | 2/2019 | Leabman et al. |
| 10,223,717 B1 | 3/2019 | Bell |

(56) References Cited

U.S. PATENT DOCUMENTS

| | | |
|---|---|---|
| 10,224,758 B2 | 3/2019 | Leabman et al. |
| 10,224,982 B1 | 3/2019 | Leabman |
| 10,230,266 B1 | 3/2019 | Leabman et al. |
| 10,243,414 B1 | 3/2019 | Leabman et al. |
| 10,256,657 B2 | 4/2019 | Hosseini et al. |
| 10,256,677 B2 | 4/2019 | Hosseini et al. |
| 10,263,432 B1 | 4/2019 | Leabman et al. |
| 10,263,476 B2 | 4/2019 | Leabman |
| 10,270,261 B2 | 4/2019 | Bell et al. |
| 10,277,054 B2 | 4/2019 | Hosseini |
| 10,291,055 B1 | 5/2019 | Bell et al. |
| 10,291,056 B2 | 5/2019 | Bell et al. |
| 10,291,066 B1 | 5/2019 | Leabman |
| 10,291,294 B2 | 5/2019 | Leabman |
| 10,298,024 B2 | 5/2019 | Leabman |
| 10,298,133 B2 | 5/2019 | Leabman |
| 10,305,315 B2 | 5/2019 | Leabman et al. |
| 10,312,715 B2 | 6/2019 | Leabman |
| 10,320,446 B2 | 6/2019 | Hosseini |
| 10,333,332 B1 | 6/2019 | Hosseini |
| 10,355,534 B2 | 7/2019 | Johnston et al. |
| 10,389,161 B2 | 8/2019 | Hosseini et al. |
| 10,396,588 B2 | 8/2019 | Leabman |
| 10,396,604 B2 | 8/2019 | Bell et al. |
| 10,439,442 B2 | 10/2019 | Hosseini et al. |
| 10,439,448 B2 | 10/2019 | Bell et al. |
| 10,447,093 B2 | 10/2019 | Hosseini |
| 10,476,312 B2 | 11/2019 | Johnston et al. |
| 10,483,768 B2 | 11/2019 | Bell et al. |
| 10,490,346 B2 | 11/2019 | Contopanagos |
| 10,491,029 B2 | 11/2019 | Hosseini |
| 10,498,144 B2 | 12/2019 | Leabman et al. |
| 10,511,097 B2 | 12/2019 | Kornaros et al. |
| 10,511,196 B2 | 12/2019 | Hosseini |
| 10,516,289 B2 | 12/2019 | Leabman et al. |
| 10,516,301 B2 | 12/2019 | Leabman |
| 10,523,033 B2 | 12/2019 | Leabman |
| 10,523,058 B2 | 12/2019 | Leabman |
| 2001/0027876 A1 | 10/2001 | Tsukamoto et al. |
| 2002/0001307 A1 | 1/2002 | Nguyen et al. |
| 2002/0024471 A1 | 2/2002 | Ishitobi |
| 2002/0028655 A1 | 3/2002 | Rosener et al. |
| 2002/0034958 A1 | 3/2002 | Oberschmidt et al. |
| 2002/0054330 A1 | 5/2002 | Jinbo et al. |
| 2002/0065052 A1 | 5/2002 | Pande et al. |
| 2002/0072784 A1 | 6/2002 | Sheppard et al. |
| 2002/0095980 A1 | 7/2002 | Breed et al. |
| 2002/0103447 A1 | 8/2002 | Terry |
| 2002/0123776 A1 | 9/2002 | Von Arx |
| 2002/0133592 A1 | 9/2002 | Matsuda |
| 2002/0171594 A1 | 11/2002 | Fang |
| 2002/0172223 A1 | 11/2002 | Stilp |
| 2003/0005759 A1 | 1/2003 | Breed et al. |
| 2003/0038750 A1 | 2/2003 | Chen |
| 2003/0058187 A1 | 3/2003 | Billiet et al. |
| 2003/0076274 A1 | 4/2003 | Phelan et al. |
| 2003/0179152 A1 | 9/2003 | Watada et al. |
| 2003/0179573 A1 | 9/2003 | Chun |
| 2003/0192053 A1 | 10/2003 | Sheppard et al. |
| 2004/0019624 A1 | 1/2004 | Sukegawa |
| 2004/0020100 A1 | 2/2004 | O'Brian et al. |
| 2004/0036657 A1 | 2/2004 | Forster et al. |
| 2004/0066251 A1 | 4/2004 | Eleftheriades et al. |
| 2004/0107641 A1 | 6/2004 | Walton et al. |
| 2004/0113543 A1 | 6/2004 | Daniels |
| 2004/0119675 A1 | 6/2004 | Washio et al. |
| 2004/0130425 A1 | 7/2004 | Dayan et al. |
| 2004/0130442 A1 | 7/2004 | Breed |
| 2004/0142733 A1 | 7/2004 | Parise |
| 2004/0145342 A1 | 7/2004 | Lyon |
| 2004/0155832 A1 | 8/2004 | Yuanzhu |
| 2004/0196190 A1 | 10/2004 | Mendolia et al. |
| 2004/0203979 A1 | 10/2004 | Attar et al. |
| 2004/0207559 A1 | 10/2004 | Milosavljevic |
| 2004/0218759 A1 | 11/2004 | Yacobi |
| 2004/0259604 A1 | 12/2004 | Mickle et al. |
| 2004/0263124 A1 | 12/2004 | Wieck et al. |
| 2005/0007276 A1 | 1/2005 | Barrick et al. |
| 2005/0030118 A1 | 2/2005 | Wang |
| 2005/0046584 A1 | 3/2005 | Breed |
| 2005/0055316 A1 | 3/2005 | Williams |
| 2005/0077872 A1 | 4/2005 | Single |
| 2005/0093766 A1 | 5/2005 | Turner |
| 2005/0116683 A1 | 6/2005 | Cheng |
| 2005/0117660 A1 | 6/2005 | Vialle et al. |
| 2005/0134517 A1 | 6/2005 | Gottl |
| 2005/0171411 A1 | 8/2005 | KenKnight |
| 2005/0198673 A1 | 9/2005 | Kit et al. |
| 2005/0227619 A1 | 10/2005 | Lee et al. |
| 2005/0232469 A1 | 10/2005 | Schofield |
| 2005/0237249 A1 | 10/2005 | Nagel |
| 2005/0237258 A1 | 10/2005 | Abramov et al. |
| 2005/0282591 A1 | 12/2005 | Shaff |
| 2006/0013335 A1 | 1/2006 | Leabman |
| 2006/0019712 A1 | 1/2006 | Choi |
| 2006/0030279 A1 | 2/2006 | Leabman et al. |
| 2006/0033674 A1 | 2/2006 | Essig, Jr. et al. |
| 2006/0071308 A1 | 4/2006 | Tang et al. |
| 2006/0092079 A1 | 5/2006 | de Rochemont |
| 2006/0094425 A1 | 5/2006 | Mickle et al. |
| 2006/0113955 A1 | 6/2006 | Nunally |
| 2006/0119532 A1 | 6/2006 | Yun et al. |
| 2006/0136004 A1 | 6/2006 | Cowan et al. |
| 2006/0160517 A1 | 7/2006 | Yoon |
| 2006/0183473 A1 | 8/2006 | Ukon |
| 2006/0190063 A1 | 8/2006 | Kanzius |
| 2006/0192913 A1 | 8/2006 | Shutou et al. |
| 2006/0199620 A1 | 9/2006 | Greene et al. |
| 2006/0238365 A1 | 10/2006 | Vecchione et al. |
| 2006/0266564 A1 | 11/2006 | Perlman et al. |
| 2006/0266917 A1 | 11/2006 | Baldis et al. |
| 2006/0278706 A1 | 12/2006 | Hatakayama et al. |
| 2006/0284593 A1 | 12/2006 | Nagy et al. |
| 2006/0287094 A1 | 12/2006 | Mahaffey et al. |
| 2007/0007821 A1 | 1/2007 | Rossetti |
| 2007/0019693 A1 | 1/2007 | Graham |
| 2007/0021140 A1 | 1/2007 | Keyes |
| 2007/0060185 A1 | 3/2007 | Simon et al. |
| 2007/0070490 A1 | 3/2007 | Tsunoda et al. |
| 2007/0090997 A1 | 4/2007 | Brown et al. |
| 2007/0093269 A1 | 4/2007 | Leabman et al. |
| 2007/0097653 A1 | 5/2007 | Gilliland et al. |
| 2007/0103110 A1 | 5/2007 | Sagoo |
| 2007/0106894 A1 | 5/2007 | Zhang |
| 2007/0109121 A1 | 5/2007 | Cohen |
| 2007/0139000 A1 | 6/2007 | Kozuma |
| 2007/0149162 A1 | 6/2007 | Greene et al. |
| 2007/0164868 A1 | 7/2007 | Deavours et al. |
| 2007/0173196 A1 | 7/2007 | Gallic |
| 2007/0173214 A1 | 7/2007 | Mickle et al. |
| 2007/0178857 A1 | 8/2007 | Greene et al. |
| 2007/0178945 A1 | 8/2007 | Cook et al. |
| 2007/0182367 A1 | 8/2007 | Partovi |
| 2007/0191074 A1 | 8/2007 | Harrist et al. |
| 2007/0191075 A1 | 8/2007 | Greene et al. |
| 2007/0197281 A1 | 8/2007 | Stronach |
| 2007/0210960 A1 | 9/2007 | Rofougaran et al. |
| 2007/0222681 A1 | 9/2007 | Greene et al. |
| 2007/0228833 A1 | 10/2007 | Stevens et al. |
| 2007/0229261 A1 | 10/2007 | Zimmerman et al. |
| 2007/0240297 A1 | 10/2007 | Yang et al. |
| 2007/0257634 A1 | 11/2007 | Leschin et al. |
| 2007/0273486 A1 | 11/2007 | Shiotsu |
| 2007/0291165 A1 | 12/2007 | Wang |
| 2007/0296639 A1 | 12/2007 | Hook et al. |
| 2007/0298846 A1 | 12/2007 | Greene et al. |
| 2008/0014897 A1 | 1/2008 | Cook et al. |
| 2008/0024376 A1 | 1/2008 | Norris et al. |
| 2008/0048917 A1 | 2/2008 | Achour et al. |
| 2008/0062062 A1 | 3/2008 | Borau et al. |
| 2008/0062255 A1 | 3/2008 | Gal |
| 2008/0067874 A1 | 3/2008 | Tseng |
| 2008/0074324 A1 | 3/2008 | Puzella et al. |
| 2008/0089277 A1 | 4/2008 | Aledander et al. |

(56) References Cited

U.S. PATENT DOCUMENTS

| | | |
|---|---|---|
| 2008/0110263 A1 | 5/2008 | Klessel et al. |
| 2008/0113816 A1 | 5/2008 | Mahaffey et al. |
| 2008/0122297 A1 | 5/2008 | Arai |
| 2008/0123383 A1 | 5/2008 | Shionoiri |
| 2008/0129536 A1 | 6/2008 | Randall et al. |
| 2008/0140278 A1 | 6/2008 | Breed |
| 2008/0169910 A1 | 7/2008 | Greene et al. |
| 2008/0197802 A1 | 8/2008 | Onishi |
| 2008/0204342 A1 | 8/2008 | Kharadly |
| 2008/0204350 A1 | 8/2008 | Tam et al. |
| 2008/0210762 A1 | 9/2008 | Osada et al. |
| 2008/0211458 A1 | 9/2008 | Lawther et al. |
| 2008/0233890 A1 | 9/2008 | Baker |
| 2008/0248758 A1 | 10/2008 | Schedelbeck et al. |
| 2008/0248846 A1 | 10/2008 | Stronach et al. |
| 2008/0258993 A1 | 10/2008 | Gummalla et al. |
| 2008/0266191 A1 | 10/2008 | Hilgers |
| 2008/0278378 A1 | 11/2008 | Chang et al. |
| 2008/0309452 A1 | 12/2008 | Zeine |
| 2009/0002493 A1 | 1/2009 | Kates |
| 2009/0010316 A1 | 1/2009 | Rofougaran et al. |
| 2009/0019183 A1 | 1/2009 | Wu et al. |
| 2009/0036065 A1 | 2/2009 | Siu |
| 2009/0039828 A1 | 2/2009 | Jakubowski |
| 2009/0047998 A1 | 2/2009 | Alberth, Jr. |
| 2009/0058354 A1 | 3/2009 | Harrison |
| 2009/0058361 A1 | 3/2009 | John |
| 2009/0058731 A1 | 3/2009 | Geary et al. |
| 2009/0060012 A1 | 3/2009 | Gresset et al. |
| 2009/0067198 A1 | 3/2009 | Graham et al. |
| 2009/0067208 A1 | 3/2009 | Martin et al. |
| 2009/0073066 A1 | 3/2009 | Jordon et al. |
| 2009/0096412 A1 | 4/2009 | Huang |
| 2009/0096413 A1 | 4/2009 | Partovi |
| 2009/0102292 A1 | 4/2009 | Cook et al. |
| 2009/0102296 A1 | 4/2009 | Greene et al. |
| 2009/0108679 A1 | 4/2009 | Porwal |
| 2009/0122847 A1 | 5/2009 | Nysen et al. |
| 2009/0128262 A1* | 5/2009 | Lee .................... H01Q 9/0485 333/219.1 |
| 2009/0157911 A1 | 6/2009 | Aihara |
| 2009/0174604 A1 | 7/2009 | Keskitalo |
| 2009/0180653 A1 | 7/2009 | Sjursen et al. |
| 2009/0200985 A1 | 8/2009 | Zane et al. |
| 2009/0206791 A1 | 8/2009 | Jung |
| 2009/0207090 A1 | 8/2009 | Pettus et al. |
| 2009/0207092 A1 | 8/2009 | Nysen et al. |
| 2009/0218884 A1 | 9/2009 | Soar |
| 2009/0218891 A1 | 9/2009 | McCollough |
| 2009/0219903 A1 | 9/2009 | Alamouti et al. |
| 2009/0243397 A1 | 10/2009 | Cook et al. |
| 2009/0256752 A1 | 10/2009 | Akkermans et al. |
| 2009/0264069 A1 | 10/2009 | Yamasuge |
| 2009/0271048 A1 | 10/2009 | Wakamatsu |
| 2009/0280866 A1 | 11/2009 | Lo et al. |
| 2009/0281678 A1 | 11/2009 | Wakamatsu |
| 2009/0284082 A1 | 11/2009 | Mohammadian |
| 2009/0284083 A1 | 11/2009 | Karalis et al. |
| 2009/0284220 A1 | 11/2009 | Toncich et al. |
| 2009/0284227 A1 | 11/2009 | Mohammadian et al. |
| 2009/0284325 A1 | 11/2009 | Rossiter et al. |
| 2009/0286475 A1 | 11/2009 | Toncich et al. |
| 2009/0286476 A1 | 11/2009 | Toncich et al. |
| 2009/0291634 A1 | 11/2009 | Saarisalo |
| 2009/0299175 A1 | 12/2009 | Bernstein et al. |
| 2009/0308936 A1 | 12/2009 | Nitzan et al. |
| 2009/0312046 A1 | 12/2009 | Clevenger et al. |
| 2009/0315412 A1 | 12/2009 | Yamamoto et al. |
| 2009/0322281 A1 | 12/2009 | Kamijo et al. |
| 2010/0001683 A1 | 1/2010 | Huang et al. |
| 2010/0007307 A1 | 1/2010 | Baarman et al. |
| 2010/0007569 A1 | 1/2010 | Sim et al. |
| 2010/0019686 A1 | 1/2010 | Gutierrez, Jr. |
| 2010/0019908 A1 | 1/2010 | Cho et al. |
| 2010/0026605 A1 | 2/2010 | Yang et al. |
| 2010/0027379 A1 | 2/2010 | Saulnier et al. |
| 2010/0029383 A1 | 2/2010 | Dai |
| 2010/0033021 A1 | 2/2010 | Bennett |
| 2010/0033390 A1 | 2/2010 | Alamouti et al. |
| 2010/0034238 A1 | 2/2010 | Bennett |
| 2010/0041453 A1 | 2/2010 | Grimm, Jr. |
| 2010/0044123 A1 | 2/2010 | Perlman et al. |
| 2010/0054200 A1 | 3/2010 | Tsai |
| 2010/0060534 A1 | 3/2010 | Oodachi |
| 2010/0066631 A1 | 3/2010 | Puzella et al. |
| 2010/0075607 A1 | 3/2010 | Hosoya |
| 2010/0079005 A1 | 4/2010 | Hyde et al. |
| 2010/0079011 A1 | 4/2010 | Hyde et al. |
| 2010/0082193 A1 | 4/2010 | Chiappetta |
| 2010/0087227 A1 | 4/2010 | Francos et al. |
| 2010/0090524 A1 | 4/2010 | Obayashi |
| 2010/0090656 A1 | 4/2010 | Shearer et al. |
| 2010/0109443 A1 | 5/2010 | Cook et al. |
| 2010/0117596 A1 | 5/2010 | Cook et al. |
| 2010/0117926 A1 | 5/2010 | DeJean, II |
| 2010/0119234 A1 | 5/2010 | Suematsu et al. |
| 2010/0123618 A1 | 5/2010 | Martin et al. |
| 2010/0123624 A1 | 5/2010 | Minear et al. |
| 2010/0124040 A1 | 5/2010 | Diebel et al. |
| 2010/0127660 A1 | 5/2010 | Cook et al. |
| 2010/0142418 A1 | 6/2010 | Nishioka et al. |
| 2010/0142509 A1 | 6/2010 | Zhu et al. |
| 2010/0148723 A1 | 6/2010 | Cook et al. |
| 2010/0151808 A1 | 6/2010 | Toncich et al. |
| 2010/0156721 A1 | 6/2010 | Alamouti et al. |
| 2010/0156741 A1 | 6/2010 | Vazquez et al. |
| 2010/0164296 A1 | 7/2010 | Kurs et al. |
| 2010/0164433 A1 | 7/2010 | Janefalker et al. |
| 2010/0167664 A1 | 7/2010 | SzinI |
| 2010/0171461 A1 | 7/2010 | Baarman et al. |
| 2010/0171676 A1 | 7/2010 | Tani et al. |
| 2010/0174629 A1 | 7/2010 | Taylor et al. |
| 2010/0176934 A1 | 7/2010 | Chou et al. |
| 2010/0181961 A1 | 7/2010 | Novak et al. |
| 2010/0181964 A1 | 7/2010 | Huggins et al. |
| 2010/0194206 A1 | 8/2010 | Burdo et al. |
| 2010/0201189 A1 | 8/2010 | Kirby et al. |
| 2010/0201201 A1 | 8/2010 | Mobarhan et al. |
| 2010/0201314 A1 | 8/2010 | Toncich et al. |
| 2010/0207572 A1 | 8/2010 | Kirby et al. |
| 2010/0210233 A1 | 8/2010 | Cook et al. |
| 2010/0213895 A1 | 8/2010 | Keating et al. |
| 2010/0214177 A1 | 8/2010 | Parsche |
| 2010/0222010 A1 | 9/2010 | Ozaki et al. |
| 2010/0225270 A1 | 9/2010 | Jacobs et al. |
| 2010/0227570 A1 | 9/2010 | Hendin |
| 2010/0231470 A1 | 9/2010 | Lee et al. |
| 2010/0237709 A1 | 9/2010 | Hall et al. |
| 2010/0244576 A1 | 9/2010 | Hillan et al. |
| 2010/0253281 A1 | 10/2010 | Li |
| 2010/0256831 A1 | 10/2010 | Abramo et al. |
| 2010/0259110 A1 | 10/2010 | Kurs et al. |
| 2010/0259447 A1 | 10/2010 | Crouch |
| 2010/0264747 A1 | 10/2010 | Hall et al. |
| 2010/0277003 A1 | 11/2010 | Von Novak et al. |
| 2010/0277121 A1 | 11/2010 | Hall et al. |
| 2010/0279606 A1 | 11/2010 | Hillan et al. |
| 2010/0289341 A1 | 11/2010 | Ozaki et al. |
| 2010/0295372 A1 | 11/2010 | Hyde et al. |
| 2010/0308767 A1 | 12/2010 | Rofougaran et al. |
| 2010/0309079 A1 | 12/2010 | Rofougaran et al. |
| 2010/0309088 A1 | 12/2010 | Hyvonen et al. |
| 2010/0315045 A1 | 12/2010 | Zeine |
| 2010/0316163 A1 | 12/2010 | Forenza et al. |
| 2010/0327766 A1 | 12/2010 | Recker et al. |
| 2010/0328044 A1 | 12/2010 | Waffenschmidt et al. |
| 2010/0332401 A1 | 12/2010 | Prahlad et al. |
| 2011/0013198 A1 | 1/2011 | Shirley |
| 2011/0018360 A1 | 1/2011 | Baarman et al. |
| 2011/0028114 A1 | 2/2011 | Kerselaers |
| 2011/0031928 A1 | 2/2011 | Soar |
| 2011/0032149 A1 | 2/2011 | Leabman |
| 2011/0032866 A1 | 2/2011 | Leabman |
| 2011/0034190 A1 | 2/2011 | Leabman |

(56) References Cited

U.S. PATENT DOCUMENTS

| | | |
|---|---|---|
| 2011/0034191 A1 | 2/2011 | Leabman |
| 2011/0043047 A1 | 2/2011 | Karalis et al. |
| 2011/0043163 A1 | 2/2011 | Baarman et al. |
| 2011/0043327 A1 | 2/2011 | Baarman et al. |
| 2011/0050166 A1 | 3/2011 | Cook et al. |
| 2011/0055037 A1 | 3/2011 | Hayashigawa et al. |
| 2011/0056215 A1 | 3/2011 | Ham |
| 2011/0057607 A1 | 3/2011 | Carobolante |
| 2011/0057853 A1* | 3/2011 | Kim .......... H01Q 1/48 343/843 |
| 2011/0062788 A1 | 3/2011 | Chen et al. |
| 2011/0074342 A1 | 3/2011 | MacLaughlin |
| 2011/0074349 A1 | 3/2011 | Ghovanloo |
| 2011/0074620 A1 | 3/2011 | Wintermantel |
| 2011/0078092 A1 | 3/2011 | Kim et al. |
| 2011/0090126 A1 | 4/2011 | Szini et al. |
| 2011/0109167 A1 | 5/2011 | Park et al. |
| 2011/0114401 A1 | 5/2011 | Kanno et al. |
| 2011/0115303 A1 | 5/2011 | Baarman et al. |
| 2011/0115432 A1 | 5/2011 | El-Maleh |
| 2011/0115605 A1 | 5/2011 | Dimig et al. |
| 2011/0121660 A1 | 5/2011 | Azancot et al. |
| 2011/0122018 A1 | 5/2011 | Tarng et al. |
| 2011/0122026 A1 | 5/2011 | DeLaquil et al. |
| 2011/0127845 A1 | 6/2011 | Walley et al. |
| 2011/0127952 A1 | 6/2011 | Walley et al. |
| 2011/0133655 A1 | 6/2011 | Recker et al. |
| 2011/0133691 A1 | 6/2011 | Hautanen |
| 2011/0148578 A1 | 6/2011 | Aloi et al. |
| 2011/0148595 A1 | 6/2011 | Miller et al. |
| 2011/0151789 A1 | 6/2011 | Viglione et al. |
| 2011/0154429 A1 | 6/2011 | Stantchev |
| 2011/0156494 A1 | 6/2011 | Mashinsky |
| 2011/0156640 A1 | 6/2011 | Moshfeghi |
| 2011/0163128 A1 | 7/2011 | Taguchi et al. |
| 2011/0175455 A1 | 7/2011 | Hashiguchi |
| 2011/0175461 A1 | 7/2011 | Tinaphong |
| 2011/0181120 A1 | 7/2011 | Liu et al. |
| 2011/0182245 A1 | 7/2011 | Malkamaki et al. |
| 2011/0184842 A1 | 7/2011 | Melen |
| 2011/0188207 A1 | 8/2011 | Won et al. |
| 2011/0193688 A1 | 8/2011 | Forsell |
| 2011/0194543 A1 | 8/2011 | Zhao et al. |
| 2011/0195722 A1 | 8/2011 | Walter et al. |
| 2011/0199046 A1 | 8/2011 | Tsai et al. |
| 2011/0215086 A1 | 9/2011 | Yeh |
| 2011/0217923 A1 | 9/2011 | Ma |
| 2011/0220634 A1 | 9/2011 | Yeh |
| 2011/0221389 A1 | 9/2011 | Won et al. |
| 2011/0222272 A1 | 9/2011 | Yeh |
| 2011/0243040 A1 | 10/2011 | Khan et al. |
| 2011/0243050 A1 | 10/2011 | Yanover |
| 2011/0244913 A1 | 10/2011 | Kim et al. |
| 2011/0248573 A1 | 10/2011 | Kanno et al. |
| 2011/0248575 A1 | 10/2011 | Kim et al. |
| 2011/0249678 A1 | 10/2011 | Bonicatto |
| 2011/0254377 A1 | 10/2011 | Widmer et al. |
| 2011/0254503 A1 | 10/2011 | Widmer et al. |
| 2011/0259953 A1 | 10/2011 | Baarman et al. |
| 2011/0273977 A1 | 11/2011 | Shapira et al. |
| 2011/0278941 A1 | 11/2011 | Krishna et al. |
| 2011/0279226 A1 | 11/2011 | Chen et al. |
| 2011/0281535 A1 | 11/2011 | Low et al. |
| 2011/0282415 A1 | 11/2011 | Eckhoff et al. |
| 2011/0285213 A1 | 11/2011 | Kowalewski |
| 2011/0286374 A1 | 11/2011 | Shin et al. |
| 2011/0291489 A1 | 12/2011 | Tsai et al. |
| 2011/0302078 A1 | 12/2011 | Failing |
| 2011/0304216 A1 | 12/2011 | Baarman |
| 2011/0304437 A1 | 12/2011 | Beeler |
| 2011/0304521 A1 | 12/2011 | Ando et al. |
| 2012/0007441 A1 | 1/2012 | John |
| 2012/0013196 A1 | 1/2012 | Kim et al. |
| 2012/0013198 A1 | 1/2012 | Uramoto et al. |
| 2012/0013296 A1 | 1/2012 | Heydari et al. |
| 2012/0019419 A1 | 1/2012 | Prat et al. |
| 2012/0043887 A1 | 2/2012 | Mesibov |
| 2012/0051109 A1 | 3/2012 | Kim et al. |
| 2012/0051294 A1 | 3/2012 | Guillouard |
| 2012/0056486 A1 | 3/2012 | Endo et al. |
| 2012/0056741 A1 | 3/2012 | Zhu et al. |
| 2012/0068906 A1 | 3/2012 | Asher et al. |
| 2012/0074891 A1 | 3/2012 | Anderson et al. |
| 2012/0075072 A1 | 3/2012 | Pappu |
| 2012/0080944 A1 | 4/2012 | Recker et al. |
| 2012/0080957 A1 | 4/2012 | Cooper et al. |
| 2012/0086284 A1 | 4/2012 | Capanella et al. |
| 2012/0086615 A1 | 4/2012 | Norair |
| 2012/0095617 A1 | 4/2012 | Martin et al. |
| 2012/0098350 A1 | 4/2012 | Campanella et al. |
| 2012/0098485 A1 | 4/2012 | Kang et al. |
| 2012/0099675 A1 | 4/2012 | Kitamura et al. |
| 2012/0103562 A1 | 5/2012 | Clayton |
| 2012/0104849 A1 | 5/2012 | Jackson |
| 2012/0105252 A1 | 5/2012 | Wang |
| 2012/0112532 A1 | 5/2012 | Kesler et al. |
| 2012/0119914 A1 | 5/2012 | Uchida |
| 2012/0126743 A1 | 5/2012 | Rivers, Jr. |
| 2012/0132647 A1 | 5/2012 | Beverly et al. |
| 2012/0133214 A1 | 5/2012 | Yun et al. |
| 2012/0142291 A1 | 6/2012 | Rath et al. |
| 2012/0146426 A1 | 6/2012 | Sabo |
| 2012/0146576 A1 | 6/2012 | Partovi |
| 2012/0146577 A1 | 6/2012 | Tanabe |
| 2012/0147802 A1 | 6/2012 | Ukita et al. |
| 2012/0149307 A1 | 6/2012 | Terada et al. |
| 2012/0150670 A1 | 6/2012 | Taylor et al. |
| 2012/0153894 A1 | 6/2012 | Widmer et al. |
| 2012/0157019 A1 | 6/2012 | Li |
| 2012/0161531 A1 | 6/2012 | Kim et al. |
| 2012/0161544 A1 | 6/2012 | Kashiwagi et al. |
| 2012/0169276 A1 | 7/2012 | Wang |
| 2012/0169278 A1 | 7/2012 | Choi |
| 2012/0173418 A1 | 7/2012 | Beardsmore et al. |
| 2012/0179004 A1 | 7/2012 | Roesicke et al. |
| 2012/0181973 A1 | 7/2012 | Lyden |
| 2012/0182427 A1 | 7/2012 | Marshall |
| 2012/0188142 A1 | 7/2012 | Shashi et al. |
| 2012/0187851 A1 | 8/2012 | Huggins et al. |
| 2012/0193999 A1 | 8/2012 | Zeine |
| 2012/0200399 A1 | 8/2012 | Chae |
| 2012/0201153 A1 | 8/2012 | Bharadia et al. |
| 2012/0201173 A1 | 8/2012 | Jian et al. |
| 2012/0206299 A1 | 8/2012 | Valdes-Garcia |
| 2012/0211214 A1 | 8/2012 | Phan |
| 2012/0212071 A1 | 8/2012 | Miyabayashi et al. |
| 2012/0212072 A1 | 8/2012 | Miyabayashi et al. |
| 2012/0214462 A1 | 8/2012 | Chu et al. |
| 2012/0214536 A1 | 8/2012 | Kim et al. |
| 2012/0228392 A1 | 9/2012 | Cameron et al. |
| 2012/0228956 A1 | 9/2012 | Kamata |
| 2012/0231856 A1 | 9/2012 | Lee et al. |
| 2012/0235636 A1 | 9/2012 | Partovi |
| 2012/0242283 A1 | 9/2012 | Kim et al. |
| 2012/0248886 A1 | 10/2012 | Kesler et al. |
| 2012/0248888 A1 | 10/2012 | Kesler et al. |
| 2012/0248891 A1 | 10/2012 | Drennen |
| 2012/0249051 A1 | 10/2012 | Son et al. |
| 2012/0262002 A1 | 10/2012 | Widmer et al. |
| 2012/0265272 A1 | 10/2012 | Judkins |
| 2012/0267900 A1 | 10/2012 | Huffman et al. |
| 2012/0268238 A1 | 10/2012 | Park et al. |
| 2012/0274154 A1 | 11/2012 | DeLuca |
| 2012/0280650 A1 | 11/2012 | Kim et al. |
| 2012/0286582 A1 | 11/2012 | Kim et al. |
| 2012/0292993 A1 | 11/2012 | Mettler et al. |
| 2012/0293021 A1 | 11/2012 | Teggatz et al. |
| 2012/0293119 A1 | 11/2012 | Park et al. |
| 2012/0299389 A1 | 11/2012 | Lee et al. |
| 2012/0299540 A1 | 11/2012 | Perry |
| 2012/0299541 A1 | 11/2012 | Perry |
| 2012/0299542 A1 | 11/2012 | Perry |
| 2012/0300588 A1 | 11/2012 | Perry |
| 2012/0300592 A1 | 11/2012 | Perry |

(56) References Cited

U.S. PATENT DOCUMENTS

| | | |
|---|---|---|
| 2012/0300593 A1 | 11/2012 | Perry |
| 2012/0306433 A1 | 12/2012 | Kim et al. |
| 2012/0306705 A1 | 12/2012 | Sakurai et al. |
| 2012/0306707 A1 | 12/2012 | Yang et al. |
| 2012/0306720 A1 | 12/2012 | Tanmi et al. |
| 2012/0307873 A1 | 12/2012 | Kim et al. |
| 2012/0309295 A1 | 12/2012 | Maguire |
| 2012/0309308 A1 | 12/2012 | Kim et al. |
| 2012/0309332 A1 | 12/2012 | Liao |
| 2012/0313446 A1 | 12/2012 | Park et al. |
| 2012/0313449 A1 | 12/2012 | Kurs |
| 2012/0313835 A1 | 12/2012 | Gebretnsae |
| 2012/0326660 A1 | 12/2012 | Lu et al. |
| 2013/0002550 A1 | 1/2013 | Zalewski |
| 2013/0018439 A1 | 1/2013 | Chow et al. |
| 2013/0024059 A1 | 1/2013 | Miller et al. |
| 2013/0026981 A1 | 1/2013 | Van Der Lee |
| 2013/0026982 A1 | 1/2013 | Rothenbaum |
| 2013/0032589 A1 | 2/2013 | Chung |
| 2013/0033571 A1 | 2/2013 | Steen |
| 2013/0038124 A1 | 2/2013 | Newdoll et al. |
| 2013/0038402 A1 | 2/2013 | Karalis et al. |
| 2013/0043738 A1 | 2/2013 | Park et al. |
| 2013/0044035 A1 | 2/2013 | Zhuang |
| 2013/0049471 A1 | 2/2013 | Oleynik |
| 2013/0049475 A1 | 2/2013 | Kim et al. |
| 2013/0049484 A1 | 2/2013 | Weissentern et al. |
| 2013/0057078 A1 | 3/2013 | Lee |
| 2013/0057205 A1 | 3/2013 | Lee et al. |
| 2013/0057210 A1 | 3/2013 | Negaard et al. |
| 2013/0057364 A1 | 3/2013 | Kesler et al. |
| 2013/0058379 A1 | 3/2013 | Kim et al. |
| 2013/0062959 A1 | 3/2013 | Lee et al. |
| 2013/0063082 A1 | 3/2013 | Lee et al. |
| 2013/0063143 A1 | 3/2013 | Adalsteinsson et al. |
| 2013/0063266 A1 | 3/2013 | Yunker et al. |
| 2013/0069444 A1 | 3/2013 | Waffenschmidt et al. |
| 2013/0076308 A1 | 3/2013 | Niskala et al. |
| 2013/0077650 A1 | 3/2013 | Traxler et al. |
| 2013/0078918 A1 | 3/2013 | Crowley et al. |
| 2013/0082651 A1 | 4/2013 | Park et al. |
| 2013/0082653 A1 | 4/2013 | Lee et al. |
| 2013/0083774 A1 | 4/2013 | Son et al. |
| 2013/0088082 A1 | 4/2013 | Kang et al. |
| 2013/0088090 A1 | 4/2013 | Wu |
| 2013/0088192 A1 | 4/2013 | Eaton |
| 2013/0088331 A1 | 4/2013 | Cho |
| 2013/0093388 A1 | 4/2013 | Partovi |
| 2013/0099389 A1 | 4/2013 | Hong et al. |
| 2013/0099586 A1 | 4/2013 | Kato |
| 2013/0106197 A1 | 5/2013 | Bae et al. |
| 2013/0107023 A1 | 5/2013 | Tanaka et al. |
| 2013/0119777 A1 | 5/2013 | Rees |
| 2013/0119778 A1 | 5/2013 | Jung |
| 2013/0119929 A1 | 5/2013 | Partovi |
| 2013/0120052 A1 | 5/2013 | Siska |
| 2013/0120205 A1 | 5/2013 | Thomson et al. |
| 2013/0120206 A1 | 5/2013 | Biancotto et al. |
| 2013/0120217 A1 | 5/2013 | Ueda et al. |
| 2013/0130621 A1 | 5/2013 | Kim et al. |
| 2013/0132010 A1 | 5/2013 | Winger et al. |
| 2013/0134923 A1 | 5/2013 | Smith |
| 2013/0137455 A1 | 5/2013 | Xia |
| 2013/0141037 A1 | 6/2013 | Jenwatanavet et al. |
| 2013/0148341 A1 | 6/2013 | Williams |
| 2013/0149975 A1 | 6/2013 | Yu et al. |
| 2013/0154387 A1 | 6/2013 | Lee et al. |
| 2013/0155748 A1 | 6/2013 | Sundstrom |
| 2013/0157729 A1 | 6/2013 | Tabe |
| 2013/0162335 A1 | 6/2013 | Kim et al. |
| 2013/0169061 A1 | 7/2013 | Microshnichenko et al. |
| 2013/0169219 A1 | 7/2013 | Gray |
| 2013/0169348 A1 | 7/2013 | Shi |
| 2013/0171939 A1 | 7/2013 | Tian et al. |
| 2013/0175877 A1 | 7/2013 | Abe et al. |
| 2013/0178253 A1 | 7/2013 | Karaoguz |
| 2013/0181881 A1 | 7/2013 | Christie et al. |
| 2013/0187475 A1 | 7/2013 | Vendik |
| 2013/0190031 A1 | 7/2013 | Persson et al. |
| 2013/0193769 A1 | 8/2013 | Mehta et al. |
| 2013/0197320 A1 | 8/2013 | Albert et al. |
| 2013/0200064 A1 | 8/2013 | Alexander |
| 2013/0207477 A1 | 8/2013 | Nam et al. |
| 2013/0207604 A1 | 8/2013 | Zeine |
| 2013/0207879 A1 | 8/2013 | Rada et al. |
| 2013/0210357 A1 | 8/2013 | Qin et al. |
| 2013/0221757 A1 | 8/2013 | Cho et al. |
| 2013/0222201 A1 | 8/2013 | Ma et al. |
| 2013/0234530 A1 | 9/2013 | Miyauchi |
| 2013/0234536 A1 | 9/2013 | Chemishkian et al. |
| 2013/0234658 A1 | 9/2013 | Endo et al. |
| 2013/0241306 A1 | 9/2013 | Aber et al. |
| 2013/0241468 A1 | 9/2013 | Moshfeghi |
| 2013/0241474 A1 | 9/2013 | Moshfeghi |
| 2013/0249478 A1 | 9/2013 | Hirano |
| 2013/0249479 A1 | 9/2013 | Partovi |
| 2013/0250102 A1 | 9/2013 | Scanlon et al. |
| 2013/0254578 A1 | 9/2013 | Huang et al. |
| 2013/0264997 A1 | 10/2013 | Lee et al. |
| 2013/0268782 A1 | 10/2013 | Tam et al. |
| 2013/0270923 A1 | 10/2013 | Cook et al. |
| 2013/0278076 A1 | 10/2013 | Proud |
| 2013/0278209 A1 | 10/2013 | Von Novak |
| 2013/0285464 A1 | 10/2013 | Miwa |
| 2013/0285477 A1 | 10/2013 | Lo et al. |
| 2013/0285606 A1 | 10/2013 | Ben-Shalom et al. |
| 2013/0288600 A1 | 10/2013 | Kuusilinna et al. |
| 2013/0288617 A1 | 10/2013 | Kim et al. |
| 2013/0293423 A1 | 11/2013 | Moshfeghi |
| 2013/0307751 A1 | 11/2013 | Yu-Juin et al. |
| 2013/0310020 A1 | 11/2013 | Kazuhiro |
| 2013/0311798 A1 | 11/2013 | Sultenfuss |
| 2013/0328417 A1 | 12/2013 | Takeuchi |
| 2013/0334883 A1 | 12/2013 | Kim et al. |
| 2013/0339108 A1 | 12/2013 | Ryder et al. |
| 2013/0343208 A1 | 12/2013 | Sexton et al. |
| 2013/0343251 A1 | 12/2013 | Zhang |
| 2014/0001846 A1 | 1/2014 | Mosebrook |
| 2014/0001875 A1 | 1/2014 | Nahidipour |
| 2014/0001876 A1 | 1/2014 | Fujiwara et al. |
| 2014/0006017 A1 | 1/2014 | Sen |
| 2014/0008992 A1 | 1/2014 | Leabman |
| 2014/0008993 A1 | 1/2014 | Leabman |
| 2014/0009108 A1 | 1/2014 | Leabman |
| 2014/0009110 A1 | 1/2014 | Lee |
| 2014/0011531 A1 | 1/2014 | Burstrom et al. |
| 2014/0015336 A1 | 1/2014 | Weber et al. |
| 2014/0015344 A1 | 1/2014 | Mohamadi |
| 2014/0021907 A1 | 1/2014 | Yun et al. |
| 2014/0021908 A1 | 1/2014 | McCool |
| 2014/0035524 A1 | 2/2014 | Zeine |
| 2014/0035526 A1 | 2/2014 | Tripathi et al. |
| 2014/0035786 A1 | 2/2014 | Ley |
| 2014/0043248 A1 | 2/2014 | Yeh |
| 2014/0049422 A1 | 2/2014 | Von Novak et al. |
| 2014/0054971 A1 | 2/2014 | Kissin |
| 2014/0055098 A1 | 2/2014 | Lee et al. |
| 2014/0057618 A1 | 2/2014 | Zirwas et al. |
| 2014/0062395 A1 | 3/2014 | Kwon et al. |
| 2014/0082435 A1 | 3/2014 | Kitgawa |
| 2014/0086125 A1 | 3/2014 | Polo et al. |
| 2014/0086592 A1 | 3/2014 | Nakahara et al. |
| 2014/0091756 A1 | 4/2014 | Ofstein et al. |
| 2014/0091968 A1 | 4/2014 | Harel et al. |
| 2014/0091974 A1 | 4/2014 | Desclos et al. |
| 2014/0103869 A1 | 4/2014 | Radovic |
| 2014/0104157 A1 | 4/2014 | Burns |
| 2014/0111147 A1 | 4/2014 | Soar |
| 2014/0113689 A1 | 4/2014 | Lee |
| 2014/0117946 A1 | 5/2014 | Muller et al. |
| 2014/0118140 A1 | 5/2014 | Amis |
| 2014/0128107 A1 | 5/2014 | An |
| 2014/0132210 A1 | 5/2014 | Partovi |
| 2014/0133279 A1 | 5/2014 | Khuri-Yakub |

(56) References Cited

U.S. PATENT DOCUMENTS

| | | |
|---|---|---|
| 2014/0139034 A1 | 5/2014 | Sankar et al. |
| 2014/0139039 A1 | 5/2014 | Cook et al. |
| 2014/0139180 A1 | 5/2014 | Kim et al. |
| 2014/0141838 A1 | 5/2014 | Cai et al. |
| 2014/0142876 A1 | 5/2014 | John et al. |
| 2014/0143933 A1 | 5/2014 | Low et al. |
| 2014/0145879 A1 | 5/2014 | Pan |
| 2014/0145884 A1 | 5/2014 | Dang et al. |
| 2014/0152117 A1 | 6/2014 | Sanker |
| 2014/0159651 A1 | 6/2014 | Von Novak et al. |
| 2014/0159652 A1 | 6/2014 | Hall et al. |
| 2014/0159662 A1 | 6/2014 | Furui |
| 2014/0159667 A1 | 6/2014 | Kim et al. |
| 2014/0169385 A1 | 6/2014 | Hadani et al. |
| 2014/0175893 A1 | 6/2014 | Sengupta et al. |
| 2014/0176054 A1 | 6/2014 | Porat et al. |
| 2014/0176061 A1 | 6/2014 | Cheatham, III et al. |
| 2014/0176082 A1 | 6/2014 | Visser |
| 2014/0177399 A1 | 6/2014 | Teng et al. |
| 2014/0183964 A1 | 7/2014 | Walley |
| 2014/0184148 A1 | 7/2014 | Van Der Lee et al. |
| 2014/0184155 A1 | 7/2014 | Cha |
| 2014/0184163 A1 | 7/2014 | Das et al. |
| 2014/0184170 A1 | 7/2014 | Jeong |
| 2014/0191568 A1 | 7/2014 | Partovi |
| 2014/0191818 A1 | 7/2014 | Waffenschmidt et al. |
| 2014/0194092 A1 | 7/2014 | Wanstedt et al. |
| 2014/0194095 A1 | 7/2014 | Wanstedt et al. |
| 2014/0197691 A1 | 7/2014 | Wang |
| 2014/0203629 A1 | 7/2014 | Hoffman et al. |
| 2014/0206384 A1 | 7/2014 | Kim et al. |
| 2014/0210281 A1 | 7/2014 | Ito et al. |
| 2014/0217955 A1 | 8/2014 | Lin |
| 2014/0217967 A1 | 8/2014 | Zeine et al. |
| 2014/0225805 A1 | 8/2014 | Pan et al. |
| 2014/0232320 A1 | 8/2014 | Ento July et al. |
| 2014/0232610 A1 | 8/2014 | Shigemoto et al. |
| 2014/0239733 A1 | 8/2014 | Mach et al. |
| 2014/0241231 A1 | 8/2014 | Zeine |
| 2014/0245036 A1 | 8/2014 | Oishi |
| 2014/0246416 A1 | 9/2014 | White |
| 2014/0247152 A1 | 9/2014 | Proud |
| 2014/0252813 A1 | 9/2014 | Lee et al. |
| 2014/0252866 A1 | 9/2014 | Walsh et al. |
| 2014/0265725 A1 | 9/2014 | Angle et al. |
| 2014/0265727 A1 | 9/2014 | Berte |
| 2014/0265943 A1 | 9/2014 | Angle et al. |
| 2014/0266025 A1 | 9/2014 | Jakubowski |
| 2014/0266946 A1 | 9/2014 | Bily et al. |
| 2014/0273819 A1 | 9/2014 | Nadakuduti et al. |
| 2014/0273892 A1 | 9/2014 | Nourbakhsh |
| 2014/0281655 A1 | 9/2014 | Angle et al. |
| 2014/0292090 A1 | 10/2014 | Cordeiro et al. |
| 2014/0292451 A1 | 10/2014 | Zimmerman |
| 2014/0300452 A1 | 10/2014 | Rofe et al. |
| 2014/0312706 A1 | 10/2014 | Fiorello et al. |
| 2014/0325218 A1 | 10/2014 | Shimizu et al. |
| 2014/0327320 A1 | 11/2014 | Muhs et al. |
| 2014/0327390 A1 | 11/2014 | Park et al. |
| 2014/0333142 A1 | 11/2014 | Desrosiers |
| 2014/0346860 A1 | 11/2014 | Aubry et al. |
| 2014/0354063 A1 | 12/2014 | Leabman et al. |
| 2014/0354221 A1 | 12/2014 | Leabman et al. |
| 2014/0355718 A1 | 12/2014 | Guan et al. |
| 2014/0357309 A1 | 12/2014 | Leabman et al. |
| 2014/0368048 A1 | 12/2014 | Leabman et al. |
| 2014/0368161 A1 | 12/2014 | Leabman et al. |
| 2014/0368405 A1 | 12/2014 | Ek et al. |
| 2014/0375139 A1 | 12/2014 | Tsukamoto |
| 2014/0375253 A1 | 12/2014 | Leabman et al. |
| 2014/0375255 A1 | 12/2014 | Leabman et al. |
| 2014/0375258 A1 | 12/2014 | Arkhipenkov |
| 2014/0375261 A1 | 12/2014 | Manova-Elssibony et al. |
| 2014/0376646 A1 | 12/2014 | Leabman et al. |
| 2015/0001949 A1 | 1/2015 | Leabman et al. |
| 2015/0002086 A1 | 1/2015 | Matos et al. |
| 2015/0003207 A1 | 1/2015 | Lee et al. |
| 2015/0008980 A1 | 1/2015 | Kim et al. |
| 2015/0011160 A1 | 1/2015 | Uurgovan et al. |
| 2015/0015180 A1 | 1/2015 | Miller et al. |
| 2015/0015182 A1 | 1/2015 | Brandtman et al. |
| 2015/0015192 A1 | 1/2015 | Leabamn |
| 2015/0015194 A1 | 1/2015 | Leabman et al. |
| 2015/0015195 A1 | 1/2015 | Leabman et al. |
| 2015/0021990 A1 | 1/2015 | Myer et al. |
| 2015/0022008 A1 | 1/2015 | Leabman et al. |
| 2015/0022009 A1 | 1/2015 | Leabman et al. |
| 2015/0022010 A1 | 1/2015 | Leabman et al. |
| 2015/0022194 A1 | 1/2015 | Almalki et al. |
| 2015/0023204 A1 | 1/2015 | Wil et al. |
| 2015/0028688 A1 | 1/2015 | Masaoka |
| 2015/0028694 A1 | 1/2015 | Leabman et al. |
| 2015/0028697 A1 | 1/2015 | Leabman et al. |
| 2015/0028875 A1 | 1/2015 | Irie et al. |
| 2015/0029397 A1 | 1/2015 | Leabman et al. |
| 2015/0035378 A1 | 2/2015 | Calhoun et al. |
| 2015/0035715 A1 | 2/2015 | Kim et al. |
| 2015/0039482 A1 | 2/2015 | Fuinaga |
| 2015/0041459 A1 | 2/2015 | Leabman et al. |
| 2015/0042264 A1 | 2/2015 | Leabman et al. |
| 2015/0042265 A1 | 2/2015 | Leabman et al. |
| 2015/0044977 A1 | 2/2015 | Ramasamy et al. |
| 2015/0046526 A1 | 2/2015 | Bush et al. |
| 2015/0061404 A1 | 3/2015 | Lamenza et al. |
| 2015/0076917 A1 | 3/2015 | Leabman et al. |
| 2015/0076927 A1 | 3/2015 | Leabman et al. |
| 2015/0077036 A1 | 3/2015 | Leabman et al. |
| 2015/0077037 A1 | 3/2015 | Leabman et al. |
| 2015/0091520 A1 | 4/2015 | Blum et al. |
| 2015/0091706 A1 | 4/2015 | Chemishkian et al. |
| 2015/0097442 A1 | 4/2015 | Muurinen |
| 2015/0097663 A1 | 4/2015 | Sloo et al. |
| 2015/0102681 A1 | 4/2015 | Leabman et al. |
| 2015/0102764 A1 | 4/2015 | Leabman et al. |
| 2015/0102769 A1 | 4/2015 | Leabman et al. |
| 2015/0102942 A1 | 4/2015 | Houser et al. |
| 2015/0102973 A1 | 4/2015 | Hand et al. |
| 2015/0108848 A1 | 4/2015 | Joehren |
| 2015/0109181 A1 | 4/2015 | Hyde et al. |
| 2015/0115877 A1 | 4/2015 | Aria et al. |
| 2015/0115878 A1 | 4/2015 | Park |
| 2015/0116153 A1 | 4/2015 | Chen et al. |
| 2015/0123483 A1 | 5/2015 | Leabman et al. |
| 2015/0123496 A1 | 5/2015 | Leabman et al. |
| 2015/0128733 A1 | 5/2015 | Taylor et al. |
| 2015/0130285 A1 | 5/2015 | Leabman et al. |
| 2015/0130293 A1 | 5/2015 | Hajimiri et al. |
| 2015/0137612 A1 | 5/2015 | Yamakawa et al. |
| 2015/0148664 A1 | 5/2015 | Stolka et al. |
| 2015/0155737 A1 | 6/2015 | Mayo |
| 2015/0155738 A1 | 6/2015 | Leabman et al. |
| 2015/0162662 A1 | 6/2015 | Chen et al. |
| 2015/0162751 A1 | 6/2015 | Leabman et al. |
| 2015/0162779 A1 | 6/2015 | Lee et al. |
| 2015/0171512 A1 | 6/2015 | Chen et al. |
| 2015/0171513 A1 | 6/2015 | Chen et al. |
| 2015/0171656 A1 | 6/2015 | Leabman et al. |
| 2015/0171658 A1 | 6/2015 | Manova-Elssibony et al. |
| 2015/0171931 A1 | 6/2015 | Won et al. |
| 2015/0177326 A1 | 6/2015 | Chakraborty et al. |
| 2015/0180133 A1 | 6/2015 | Hunt |
| 2015/0180249 A1 | 6/2015 | Jeon et al. |
| 2015/0181117 A1 | 6/2015 | Park et al. |
| 2015/0187491 A1 | 7/2015 | Yanagawa |
| 2015/0188352 A1 | 7/2015 | Peek et al. |
| 2015/0199665 A1 | 7/2015 | Chu |
| 2015/0201385 A1 | 7/2015 | Mercer et al. |
| 2015/0207333 A1 | 7/2015 | Baarman et al. |
| 2015/0207542 A1 | 7/2015 | Zeine |
| 2015/0222126 A1 | 8/2015 | Leabman et al. |
| 2015/0233987 A1 | 8/2015 | Von Novak, III et al. |
| 2015/0234144 A1 | 8/2015 | Cameron et al. |
| 2015/0236520 A1 | 8/2015 | Baarman |
| 2015/0244070 A1 | 8/2015 | Cheng et al. |

(56) References Cited

U.S. PATENT DOCUMENTS

| | | |
|---|---|---|
| 2015/0244080 A1 | 8/2015 | Gregoire |
| 2015/0244187 A1 | 8/2015 | Horie |
| 2015/0244201 A1 | 8/2015 | Chu |
| 2015/0244341 A1 | 8/2015 | Ritter et al. |
| 2015/0249484 A1 | 9/2015 | Mach et al. |
| 2015/0255989 A1 | 9/2015 | Walley et al. |
| 2015/0256097 A1 | 9/2015 | Gudan et al. |
| 2015/0260835 A1 | 9/2015 | Widmer et al. |
| 2015/0262465 A1 | 9/2015 | Pritchett |
| 2015/0263534 A1 | 9/2015 | Lee et al. |
| 2015/0263548 A1 | 9/2015 | Cooper |
| 2015/0270618 A1 | 9/2015 | Zhu et al. |
| 2015/0270622 A1 | 9/2015 | Takasaki et al. |
| 2015/0270741 A1 | 9/2015 | Leabman et al. |
| 2015/0278558 A1 | 10/2015 | Priev et al. |
| 2015/0280484 A1 | 10/2015 | Radziemski et al. |
| 2015/0288074 A1 | 10/2015 | Harper et al. |
| 2015/0288438 A1 | 10/2015 | Maltsev et al. |
| 2015/0311585 A1 | 10/2015 | Church et al. |
| 2015/0312721 A1 | 10/2015 | Singh |
| 2015/0318729 A1 | 11/2015 | Leabman |
| 2015/0326024 A1 | 11/2015 | Bell et al. |
| 2015/0326025 A1 | 11/2015 | Bell et al. |
| 2015/0326051 A1 | 11/2015 | Bell et al. |
| 2015/0326063 A1 | 11/2015 | Leabman et al. |
| 2015/0326068 A1 | 11/2015 | Bell et al. |
| 2015/0326069 A1 | 11/2015 | Petras et al. |
| 2015/0326070 A1 | 11/2015 | Petras et al. |
| 2015/0326071 A1 | 11/2015 | Contopanagos |
| 2015/0326072 A1 | 11/2015 | Petras et al. |
| 2015/0326142 A1 | 11/2015 | Petras et al. |
| 2015/0326143 A1 | 11/2015 | Petras et al. |
| 2015/0327085 A1 | 11/2015 | Hadani |
| 2015/0333528 A1 | 11/2015 | Leabman |
| 2015/0333529 A1 | 11/2015 | Leabman |
| 2015/0333573 A1 | 11/2015 | Leabman |
| 2015/0333800 A1 | 11/2015 | Perry et al. |
| 2015/0339497 A1 | 11/2015 | Kurian |
| 2015/0340759 A1 | 11/2015 | Bridgelall et al. |
| 2015/0340903 A1 | 11/2015 | Bell et al. |
| 2015/0340909 A1 | 11/2015 | Bell et al. |
| 2015/0340910 A1 | 11/2015 | Petras et al. |
| 2015/0340911 A1 | 11/2015 | Bell et al. |
| 2015/0341087 A1 | 11/2015 | Moore et al. |
| 2015/0349574 A1 | 12/2015 | Leabman |
| 2015/0358222 A1 | 12/2015 | Berger et al. |
| 2015/0365137 A1 | 12/2015 | Miller et al. |
| 2015/0365138 A1 | 12/2015 | Miller et al. |
| 2016/0005068 A1 | 1/2016 | Im et al. |
| 2016/0012695 A1 | 1/2016 | Bell et al. |
| 2016/0013560 A1 | 1/2016 | Daniels |
| 2016/0013656 A1 | 1/2016 | Bell et al. |
| 2016/0013677 A1 | 1/2016 | Bell et al. |
| 2016/0013678 A1 | 1/2016 | Bell et al. |
| 2016/0013855 A1 | 1/2016 | Campos |
| 2016/0020636 A1 | 1/2016 | Khlat |
| 2016/0020647 A1 | 1/2016 | Leabman et al. |
| 2016/0020649 A1 | 1/2016 | Bell et al. |
| 2016/0020830 A1 | 1/2016 | Bell et al. |
| 2016/0028403 A1 | 1/2016 | McCaughan et al. |
| 2016/0042206 A1 | 2/2016 | Pesavento et al. |
| 2016/0054396 A1 | 2/2016 | Bell et al. |
| 2016/0054440 A1 | 2/2016 | Younis |
| 2016/0056635 A1 | 2/2016 | Bell |
| 2016/0056640 A1 | 2/2016 | Mao |
| 2016/0056669 A1 | 2/2016 | Bell |
| 2016/0056966 A1 | 2/2016 | Bell |
| 2016/0065005 A1 | 3/2016 | Won et al. |
| 2016/0079799 A1 | 3/2016 | Khlat |
| 2016/0087483 A1 | 3/2016 | Hietala et al. |
| 2016/0087486 A1 | 3/2016 | Pogorelik et al. |
| 2016/0094091 A1 | 3/2016 | Shin et al. |
| 2016/0094092 A1 | 3/2016 | Davlantes et al. |
| 2016/0099601 A1 | 4/2016 | Leabman et al. |
| 2016/0099602 A1 | 4/2016 | Leabman et al. |
| 2016/0099609 A1 | 4/2016 | Leabman et al. |
| 2016/0099610 A1 | 4/2016 | Leabman et al. |
| 2016/0099611 A1 | 4/2016 | Leabman et al. |
| 2016/0099612 A1 | 4/2016 | Leabman et al. |
| 2016/0099613 A1 | 4/2016 | Leabman et al. |
| 2016/0099614 A1 | 4/2016 | Leabman et al. |
| 2016/0099755 A1 | 4/2016 | Leabman et al. |
| 2016/0099756 A1 | 4/2016 | Leabman et al. |
| 2016/0099757 A1 | 4/2016 | Leabman et al. |
| 2016/0099758 A1 | 4/2016 | Leabman et al. |
| 2016/0100124 A1 | 4/2016 | Leabman et al. |
| 2016/0100312 A1 | 4/2016 | Bell et al. |
| 2016/0112787 A1 | 4/2016 | Rich |
| 2016/0126749 A1 | 5/2016 | Shichino et al. |
| 2016/0126752 A1 | 5/2016 | Vuori et al. |
| 2016/0126776 A1 | 5/2016 | Kim et al. |
| 2016/0141908 A1 | 5/2016 | Jakl et al. |
| 2016/0164563 A1 | 6/2016 | Khawand et al. |
| 2016/0181849 A1 | 6/2016 | Govindaraj |
| 2016/0181854 A1 | 6/2016 | Leabman |
| 2016/0181867 A1 | 6/2016 | Daniel et al. |
| 2016/0181873 A1 | 6/2016 | Mitcheson et al. |
| 2016/0191121 A1 | 6/2016 | Bell |
| 2016/0197522 A1 | 7/2016 | Zeine et al. |
| 2016/0202343 A1 | 7/2016 | Okutsu |
| 2016/0204622 A1 | 7/2016 | Leabman |
| 2016/0204642 A1 | 7/2016 | Oh |
| 2016/0233582 A1 | 8/2016 | Piskun |
| 2016/0238365 A1 | 8/2016 | Wixey et al. |
| 2016/0240908 A1 | 8/2016 | Strong |
| 2016/0248276 A1 | 8/2016 | Hong et al. |
| 2016/0294225 A1 | 10/2016 | Blum et al. |
| 2016/0299210 A1 | 10/2016 | Zeine |
| 2016/0301240 A1 | 10/2016 | Zeine |
| 2016/0322868 A1 | 11/2016 | Akuzawa et al. |
| 2016/0323000 A1 | 11/2016 | Liu et al. |
| 2016/0336804 A1 | 11/2016 | Son et al. |
| 2016/0339258 A1 | 11/2016 | Perryman et al. |
| 2016/0344098 A1 | 11/2016 | Ming |
| 2016/0359367 A1 | 12/2016 | Rothschild |
| 2016/0380464 A1 | 12/2016 | Chin et al. |
| 2016/0380466 A1 | 12/2016 | Yang et al. |
| 2017/0005481 A1 | 1/2017 | Von Novak, III |
| 2017/0005516 A9 | 1/2017 | Leabman et al. |
| 2017/0005524 A1 | 1/2017 | Akuzawa et al. |
| 2017/0005530 A1 | 1/2017 | Zeine et al. |
| 2017/0012448 A1 | 1/2017 | Miller et al. |
| 2017/0025887 A1 | 1/2017 | Hyun et al. |
| 2017/0025903 A1 | 1/2017 | Song et al. |
| 2017/0026087 A1 | 1/2017 | Tanabe |
| 2017/0040700 A1* | 2/2017 | Leung ................ H01Q 9/0485 |
| 2017/0043675 A1 | 2/2017 | Jones et al. |
| 2017/0047784 A1 | 2/2017 | Jung et al. |
| 2017/0187225 A1 | 2/2017 | Hosseini |
| 2017/0063168 A1 | 3/2017 | Uchida |
| 2017/0077733 A1 | 3/2017 | Jeong et al. |
| 2017/0077735 A1 | 3/2017 | Leabman |
| 2017/0077764 A1 | 3/2017 | Bell et al. |
| 2017/0077765 A1 | 3/2017 | Bell et al. |
| 2017/0077995 A1 | 3/2017 | Leabman |
| 2017/0085120 A1 | 3/2017 | Leabman et al. |
| 2017/0085127 A1 | 3/2017 | Leabman |
| 2017/0085437 A1 | 3/2017 | Condeixa et al. |
| 2017/0092115 A1 | 3/2017 | Sloo et al. |
| 2017/0104263 A1 | 4/2017 | Hosseini |
| 2017/0110886 A1 | 4/2017 | Reynolds et al. |
| 2017/0110888 A1 | 4/2017 | Leabman |
| 2017/0110889 A1 | 4/2017 | Bell |
| 2017/0110914 A1 | 4/2017 | Bell |
| 2017/0127196 A1 | 5/2017 | Blum et al. |
| 2017/0134686 A9 | 5/2017 | Leabman |
| 2017/0141582 A1 | 5/2017 | Adolf et al. |
| 2017/0141583 A1 | 5/2017 | Adolf et al. |
| 2017/0163076 A1 | 6/2017 | Park et al. |
| 2017/0168595 A1 | 6/2017 | Sakaguchi et al. |
| 2017/0179763 A9 | 6/2017 | Leabman |
| 2017/0179771 A1 | 6/2017 | Leabman |
| 2017/0187198 A1 | 6/2017 | Leabman |
| 2017/0187222 A1 | 6/2017 | Hosseini |

(56) References Cited

U.S. PATENT DOCUMENTS

| | | | |
|---|---|---|---|
| 2017/0187223 A1 | 6/2017 | Hosseini |
| 2017/0187228 A1 | 6/2017 | Hosseini |
| 2017/0187248 A1 | 6/2017 | Leabman |
| 2017/0214422 A1 | 7/2017 | Na et al. |
| 2017/0338695 A1 | 11/2017 | Port |
| 2018/0040929 A1 | 2/2018 | Chappelle |
| 2018/0048178 A1 | 2/2018 | Leabman |
| 2018/0090992 A1 | 3/2018 | Shrivastava et al. |
| 2018/0123400 A1 | 5/2018 | Leabman |
| 2018/0131238 A1 | 5/2018 | Leabman |
| 2018/0159355 A1 | 6/2018 | Leabman |
| 2018/0166924 A1 | 6/2018 | Hosseini |
| 2018/0166925 A1 | 6/2018 | Hosseini |
| 2018/0198199 A1 | 7/2018 | Hosseini |
| 2018/0226840 A1 | 8/2018 | Leabman |
| 2018/0241255 A1 | 8/2018 | Leabman |
| 2018/0254639 A1 | 9/2018 | Bell |
| 2018/0262040 A1 | 9/2018 | Contopanagos |
| 2018/0287431 A1 | 10/2018 | Liu et al. |
| 2018/0309314 A1 | 10/2018 | White et al. |
| 2018/0375340 A1 | 12/2018 | Bell et al. |
| 2018/0376235 A1 | 12/2018 | Leabman |
| 2019/0074728 A1 | 3/2019 | Leabman |
| 2019/0131827 A1 | 5/2019 | Johnston |
| 2019/0173323 A1 | 6/2019 | Hosseini |
| 2019/0245389 A1 | 8/2019 | Johnston et al. |
| 2019/0288567 A1 | 9/2019 | Leabman et al. |
| 2019/0372384 A1 | 12/2019 | Hosseini et al. |
| 2020/0006988 A1 | 1/2020 | Leabman |

FOREIGN PATENT DOCUMENTS

| | | |
|---|---|---|
| CN | 102860037 A | 1/2013 |
| CN | 103348563 A | 10/2013 |
| CN | 103594776 A | 2/2014 |
| CN | 203826555 U | 9/2014 |
| CN | 104090265 A | 10/2014 |
| CN | 106329116 A | 1/2017 |
| CN | 103380561 B | 9/2017 |
| DE | 200216655 U1 | 2/2002 |
| DE | 10-2003216953 A1 | 2/2015 |
| EP | 1028482 A2 | 8/2000 |
| EP | 1081506 A1 | 3/2001 |
| EP | 2346136 A1 | 7/2011 |
| EP | 2397973 A1 | 2/2012 |
| EP | 2545635 A2 | 1/2013 |
| EP | 2747195 A1 | 6/2014 |
| EP | 3067983 A1 | 9/2016 |
| EP | 3118970 A1 | 1/2017 |
| EP | 3145052 A1 | 3/2017 |
| GB | 2404497 A | 2/2005 |
| GB | 2556620 A | 6/2018 |
| JP | 2002319816 A | 10/2002 |
| JP | 2006157586 A | 6/2006 |
| JP | 2007043432 A | 2/2007 |
| JP | 2008167017 A | 7/2008 |
| JP | 2013162624 A | 8/2013 |
| JP | 2015128349 A | 7/2015 |
| JP | WO2015177859 A1 | 4/2017 |
| KR | 20060061776 A | 6/2006 |
| KR | 20070044302 A | 4/2007 |
| KR | 100755144 B1 | 9/2007 |
| KR | 20110132059 A | 12/2011 |
| KR | 20110135540 A1 | 12/2011 |
| KR | 20120009843 A | 2/2012 |
| KR | 20120108759 A | 10/2012 |
| KR | 20130026977 A | 3/2013 |
| KR | 20140023409 A | 2/2014 |
| KR | 20140023410 A | 3/2014 |
| KR | 20140085200 A | 7/2014 |
| KR | 20150077678 A | 7/2015 |
| WO | WO 1995/08125 A1 | 3/1995 |
| WO | WO 1998/31070 A1 | 7/1998 |
| WO | WO 1999/52173 A1 | 10/1999 |
| WO | WO 2000111716 A1 | 2/2001 |
| WO | WO 2003091943 A1 | 11/2003 |
| WO | WO 2004077550 A1 | 9/2004 |
| WO | WO 2006122783 | 11/2006 |
| WO | WO 2007070571 A2 | 6/2007 |
| WO | WO 2008024993 A2 | 2/2008 |
| WO | WO 2008156571 A2 | 12/2008 |
| WO | WO 2010022181 A1 | 2/2010 |
| WO | WO 2010039246 A1 | 4/2010 |
| WO | WO 2010138994 A1 | 12/2010 |
| WO | WO 2011112022 A2 | 9/2011 |
| WO | WO 2012177283 A1 | 12/2012 |
| WO | WO 2013031988 A1 | 3/2013 |
| WO | WO 2013035190 A1 | 3/2013 |
| WO | WO 2013038074 A2 | 3/2013 |
| WO | WO 2013042399 A1 | 3/2013 |
| WO | WO 2013052950 A1 | 4/2013 |
| WO | WO 2013105920 A2 | 7/2013 |
| WO | WO 2014075103 A1 | 5/2014 |
| WO | WO 2014132258 A1 | 9/2014 |
| WO | WO 2014134996 A1 | 9/2014 |
| WO | WO 2014182788 A2 | 11/2014 |
| WO | WO 2014182788 A3 | 11/2014 |
| WO | WO 2014197472 A1 | 12/2014 |
| WO | WO 2014209587 A1 | 12/2014 |
| WO | WO 2015038773 A1 | 3/2015 |
| WO | WO 2015097809 A1 | 7/2015 |
| WO | WO 2015161323 A1 | 10/2015 |
| WO | WO 2016024869 A1 | 2/2016 |
| WO | WO 2016048512 A1 | 3/2016 |
| WO | WO 2016187357 A1 | 11/2016 |

OTHER PUBLICATIONS

Energous Corp., IPRP, PCT/US2014/037072, Nov. 10, 2015, 6 pgs.
Energous Corp., ISRWO, PCT/US2014/037109, Apr. 8, 2016, 12 pgs.
Energous Corp., IPRP, PCT/US2014/037109, Apr. 12, 2016, 9 pgs.
Energous Corp. ISRWO, PCT/US2014/037170, Sep. 15, 2014, 11 pgs.
Energous Corp., IPRP, PCT/US2014/037170, Nov. 10, 2015, 8 pgs.
Energous Corp., ISRWO , PCT/US2014/040648, Oct. 10, 2014, 11 pgs.
Energous Corp., IPRP , PCT/US2014/040648, Dec. 8, 2015, 8 pgs.
Energous Corp., ISRWO, PCT/US2014/040697, Oct. 1, 2014, 12 pgs.
Energous Corp.,IPRP, PCT/US2014/040697, Dec. 8, 2015, 9 pgs.
Energous Corp., ISRWO, PCT/US2014/040705, Sep. 23, 2014, 8 pgs.
Energous Corp., IPRP, PCT/US2014/040705, Dec. 8, 2015, 6 pgs.
Energous Corp., ISRWO, PCT/US2014/041323, Oct. 1, 2014, 10 pgs.
Energous Corp., IPRP, PCT/US2014/041323, Dec. 22, 2015, 8 pgs.
Energous Corp., ISRWO, PCT/US2014/041342, Jan. 27, 2015, 10 pgs.
Energous Corp., IPRP, PCT/US2014/041342, Dec. 15, 2015, 8 pgs.
Energous Corp., ISRWO, PCT/US2014/041534, Oct. 13, 2014, 10 pgs.
Energous Corp., IPRP, PCT/US2014/041534, Dec. 29, 2015, 7 pgs.
Energous Corp., ISRWO, PCT/US2014/041546, Oct. 16, 2014, 12 pgs.
Energous Corp., IPRP, PCT/US2014/041546, Dec. 29, 2015, 9 pgs.
Energous Corp., ISRWO, PCT/US2014/041558, Oct. 10, 2014, 8 pgs.
Energous Corp., IPRP, PCT/US2014/041558, Dec. 29, 2015, 6 pgs.
Energous Corp., ISRWO , PCT/US2014/044810 Oct. 21, 2014, 12 pgs.
Energous Corp., IPRP , PCT/US2014/044810, Jan. 5, 2016, 10 pgs.
Energous Corp., ISRWO, PCT/US2014/045102, Oct. 28, 2014, 14 pgs.
Energous Corp., IPRP, PCT/US2014/045102, Jan. 12, 2016, 11 pgs.
Energous Corp., ISRWO, PCT/US2014/045119, Oct. 13, 2014, 11 pgs.
Energous Corp., IPRP, PCT/US2014/045119, Jan. 12, 2016, 9 pgs.
Energous Corp., ISRWO PCT/US2014/045237, Oct. 13, 2014, 16 pgs.

(56) References Cited

OTHER PUBLICATIONS

Energous Corp., IPRP, PCT/US2014/045237, Jan. 12, 2016, 12 pgs.
Energous Corp., ISRWO, PCT/US2014/046941, Nov. 6, 2014, 11 pgs.
Energous Corp., IPRP, PCT/US2014/046941, Jan. 19, 2016, 9 pgs.
Energous Corp., ISRWO, PCT/US2014/046956, Nov. 12, 2014, 10 pgs.
Energous Corp., IPRP, PCT/US2014/046956, Jan. 19, 2016, 7 pgs.
Energous Corp., ISRWO, PCT/US2014/046961, Nov. 24, 2014, 16 pgs.
Energous Corp., IPRP, PCT/US2014/046961, Jan. 19, 2016, 8 pgs.
Energous Corp., ISRWO , PCT/US2014/047963, Nov. 7, 2014, 13 pgs.
Energous Corp., IPRP , PCT/US2014/047963, Jan. 26, 2016, 10 pgs.
Energous Corp., ISRWO, PCT/US2014/048002, Nov. 13, 2014, 11 pgs.
Energous Corp., IPRP, PCT/US2014/048002, Feb. 12, 2015 8 pgs.
Energous Corp., ISRWO, PCT/US2014/049666, Nov. 10, 2014, 7 pgs.
Energous Corp., IPRP, PCT/US2014/049666, Feb. 9, 2016, 5 pgs.
Energous Corp., ISRWO, PCT/US2014/049669, Nov. 13, 2014, 10 pgs.
Energous Corp., IPRP, PCT/US2014/049669, Feb. 9, 2016, 8 pgs.
Energous Corp., ISRWO , PCT/US2014/049673, Nov. 18, 2014, 10 pgs.
Energous Corp., IPRP , PCT/US2014/049673, Feb. 9, 2016, 6 pgs.
Energous Corp., ISRWO , PCT/US2014/054891, Dec. 18, 2014, 12 pgs.
Energous Corp., IPRP , PCT/US2014/054891, Mar. 15, 2016, 10 pgs.
Energous Corp., ISRWO , PCT/US2014/054897, Feb. 17, 2015, 10 pgs.
Energous Corp., IPRP , PCT/US2014/054897, Mar. 15, 2016, 8 pgs.
Energous Corp., ISRWO , PCT/US2014/054953, Dec. 4, 2014, 7 pgs.
Energous Corp., IPRP , PCT/US2014/054953, Mar. 22, 2016, 5 pgs.
Energous Corp., ISRWO, PCT/US2014/055195, Dec. 22, 2014, 11 pgs.
Energous Corp., IPRP, PCT/US2014/055195, Mar. 22, 2016, 9 pgs.
Energous Corp., ISRWO, PCT/US2014/059317, Feb. 24, 2015, 13 pgs.
Energous Corp., IPRP, PCT/US2014/059317, Apr. 12, 2016, 10 pgs.
Energous Corp., ISRWO, PCT/US2014/059340, Jan. 15, 2015, 13 pgs.
Energous Corp., IPRP, PCT/US2014/059340, Apr. 12, 2016, 11 pgs.
Energous Corp., ISRWO, PCT/US2014/059871, Jan. 23, 2015, 12 pgs.
Energous Corp., IPRP, PCT/US2014/059871, Apr. 12, 2016, 9 pgs.
Energous Corp., ISR, PCT/US2014/062661, Jan. 27, 2015, 3 pgs.
Energous Corp., Written Opinion, PCT/US2014/062661, Jan. 27, 2015, 9 pgs.
Energous Corp., IPRP, PCT/US2014/062661, May 3, 2016, 10 pgs.
Energous Corp., ISRWO , PCT/US2014/062672 Jan. 26, 2015, 11 pgs.
Energous Corp., IPRP , PCT/US2014/062672 May 10, 2016, 8 pgs.
Energous Corp., ISRWO, PCT/US2014/062682, Feb. 12, 2015, 10 pgs.
Energous Corp., IPRP, PCT/US2014/062682, May 3, 2016, 8 pgs.
Energous Corp., ISRWO , PCT/US2014/068282, Mar. 19, 2015, 13 pgs.
Energous Corp., IPRP, PCT/US2014/068282, Jun. 7, 2016, 10 pgs.
Energous Corp., ISRWO, PCT/US2014/068568, Mar. 20, 2015, 10 pgs.
Energous Corp., IPRP, PCT/US2014/068568, Jun. 14, 2016, 8 pgs.
Energous Corp., ISRWO, PCT/US2014/068586, Mar. 20, 2015, 11 pgs.
Energous Corp., IPRP, PCT/US2014/068586, Jun. 14, 2016, 8 pgs.
Energous Corp., ISRWO, PCT/US2015/067242, Mar. 16, 2016, 9 pgs.
Energous Corp., IPRP, PCT/US2015/067242, Jun. 27, 2017, 7 pgs.
Energous Corp., ISRWO, PCT/US2015/067243, Mar. 10, 2016, 11 pgs.
Energous Corp., IPRP, PCT/US2015/067243, Jun. 27, 2017, 7 pgs.
Energous Corp., ISRWO, PCT/US2015/067245, Mar. 17, 2016, 8 pgs.
Energous Corp., IPRP, PCT/US2015/067245, Jun. 27, 2017, 7 pgs.
Energous Corp., ISRWO, PCT/US2015/067246, May 11, 2016, 18 pgs.
Energous Corp., IPRP, PCT/US2015/067246, Jun. 27, 2017, 9 pgs.
Energous Corp., ISRWO, PCT/US2015/067249, Mar. 29, 2016, 8 pgs.
Energous Corp., IPRP, PCT/US2015/067249, Jun. 27, 2017, 7 pgs.
Energous Corp., ISRWO, PCT/US2015/67250, Mar. 30, 2016, 11 pgs.
Energous Corp., IPRP, PCT/US2015/67250, Mar. 30, 2016, 10 pgs.
Energous Corp., ISRWO , PCT/US2015/067271, Mar. 11, 2016, 6 pgs.
Energous Corp., IPRP , PCT/US2015/067271, Jul. 4, 2017, 5 pgs.
Energous Corp., ISRWO, PCT/US2015/067275, Mar. 3, 2016, 8 pgs.
Energous Corp., IPRP, PCT/US2015/067275, Jul. 4, 2017, 7 pgs.
Energous Corp., ISRWO, PCT/US2015/067279, Mar. 11, 2015, 13 pgs.
Energous Corp., IPRP, PCT/US2015/067279, Jul. 4, 2017, 7 pgs.
Energous Corp., ISRWO, PCT/US2015/067282, Jul. 5, 2016, 7 pgs.
Energous Corp., IPRP, PCT/US2015/067282, Jul. 4, 2017, 6 pgs.
Energous Corp., ISRWO, PCT/US2015/067287, Feb. 2, 2016, 8 pgs.
Energous Corp., IPRP, PCT/US2015/067287, Jul. 4, 2017, 6 pgs.
Energous Corp., ISRWO, PCT/US2015/067291, Mar. 4, 2016, 10 pgs.
Energous Corp., IPRP, PCT/US2015/067291, Jul. 4, 2017, 4 pgs.
Energous Corp., ISRWO , PCT/US2015/067294, Mar. 29, 2016, 7 pgs.
Energous Corp., IPRP , PCT/US2015/067294, Jul. 4, 2017, 6 pgs.
Energous Corp., ISRWO, PCT/US2015/067325, Mar. 10, 2016, 9 pgs.
Energous Corp., IPRP, PCT/US2015/067325, Jul. 4, 2017, 8 pgs.
Energous Corp., ISRWO , PCT/US2015/067334, Mar. 3, 2016, 6 pgs.
Energous Corp., IPRP , PCT/US2015/067334, Jul. 4, 2017, 5 pgs.
Energous Corp., ISRWO, PCT/US2016/068495, Mar. 30, 2017, 9 pgs.
Energous Corp., IPRP, PCT/US2016/068495, Jun. 26, 2018, 7 pgs.
Energous Corp., ISRWO, PCT/US2016/068498, May 17, 2017, 8 pgs.
Energous Corp., IPRP, PCT/US2016/068498, Jun. 26, 2018, 6 pgs.
Energous Corp., ISRWO, PCT/US2016/068504, Mar. 30, 2017, 8 pgs.
Energous Corp., IPRP, PCT/US2016/068504, Jun. 26, 2018, 5 pgs.
Energous Corp., ISRWO, PCT/US2016/068551, Mar. 17, 2017, 8 pgs.
Energous Corp., IPRP, PCT/US2016/068551, Jun. 26, 2018, 6 pgs.
Energous Corp., ISRWO, PCT/US2016/068565, Mar. 8, 2017, 11 pgs.
Energous Corp., IPRP, PCT/US2016/068565, Jun. 26, 2018, 9 pgs.
Energous Corp., ISRWO, PCT/US2016/068987, May 8, 2017, 10 pgs.
Energous Corp., IPRP, PCT/US2016/068987, Jul. 3, 2018, 7 pgs.
Energous Corp., ISRWO, PCT/US2016/068993, Mar. 13, 2017, 12 pgs.
Energous Corp., IPRP, PCT/US2016/068993, Jul. 3, 2018, 10 pgs.
Energous Corp., ISRWO , PCT/US2016/069313 Nov. 13, 2017, 10 pgs.
Energous Corp., IPRP , PCT/US2016/069313 Jul. 3, 2018, 7 pgs.
Energous Corp., ISRWO, PCT/US2016/069316 , Mar. 16, 2017, 15 pgs.
Energous Corp., IPRP, PCT/US2016/069316 , Jul. 3, 2018, 12 pgs.
Energous Corp., ISRWO, PCT/US2017/046800, Sep. 11, 2017, 13 pgs.

(56) References Cited

OTHER PUBLICATIONS

Energous Corp., IPRP, PCT/US2017/046800, Feb. 12, 2019, 10 pgs.
Energous Corp., ISRWO, PCT/US2017/065886, Apr. 6, 2018, 13 pgs.
Energous Corp., IPRP, PCT/US2017/065886, Jul. 18, 2019, 10 pgs.
Energous Corp., ISRWO, PCT/US2018/012806, Mar. 23, 2018, 9 pgs.
Energous Corp., IPRP, PCT/US2018/012806, Jul. 9, 2019, 6 pgs.
Energous Corp., ISRWO, PCT/US2018/025465, Jun. 22, 2018, 9 pgs.
Energous Corp., IPRP, PCT/US2018/025465, Oct. 1, 2019, 8 pgs.
Energous Corp., ISRWO, PCT/US2018/031768, Jul. 3, 2018, 9 pgs.
Energous Corp., IPRP, PCT/US2018/031768, Nov. 12, 2019, 8 pgs.
Energous Corp., ISRWO, PCT/US2018/031786, Aug. 8, 2018, 9 pgs.
Energous Corp., ISRWO, PCT/US2018/039334, Sep. 11, 2018, 9 pgs.
Energous Corp., ISRWO, PCT/US2018/051082, Dec. 12, 2018, 9 pgs.
Energous Corp., ISRWO, PCT/US2018/058178, Mar. 13, 2019, 10 pgs.
Energous Corp., ISRWO, PCT/US2018/064289, Mar. 28, 2019, 14 pgs.
Energous Corp., ISRWO, PCT/US2019/015820, May 14, 2019, 9 pgs.
Energous Corp., ISRWO, PCT/US2019/021817, Apr. 6, 2019, 11 pgs.
Energous Corp., ISRWO, PCT/US2019/039014, Oct. 4, 2019, 15 pgs.
Order Granting Reexamination Request Control No. 90013793 Aug. 31, 2016, 23 pgs.
*Ossia Inc.* vs *Energous Corp.*, PGR2016-00023-Institution Decision, Nov. 29, 2016, 29 pgs.
*Ossia Inc.* vs *Energous Corp.*, PGR2016-00024-Institution Decision, Nov. 29. 2016, 50 pgs.
*Ossia Inc.* vs *Energous Corp.*, PGR2016-00024-Judgement-Adverse, Jan. 20, 2017, 3 pgs.
ReExam Ordered Control No. 90013793 Feb. 2, 2017, 8 pgs.
*Ossia Inc.* vs *Energous Corp.*, Declaration of Stephen B. Heppe in Support of Petition for Post-Grant Review of U.S. Pat. No. 9,124,125, PGR2016-00024, May 31, 2016, 122 pgs.
*Ossia Inc.* vs *Energous Corp.*, Petition for Post-Grant Review of U.S. Pat. No. 9,124,125, May 31, 2016, 92 pgs.
*Ossia Inc.* vs *Energous Corp.*, Patent Owner Preliminary Response, Sep. 8, 2016, 95 pgs.
*Ossia Inc.* vs *Energous Corp.*, Petition for Post Grant Review of U.S. Pat. No. 9,124,125, May 31, 2016, 86 pgs.
*Ossia Inc.* vs *Energous Corp.*, Declaration of Stephen B. Heppe in Support of Petition for Post-Grant Review of U.S. Pat. No. 9,124,125, PGR2016-00023, May 31, 2016, 144 pgs.
Supplementary European Search Report, EP Patent Application No. EP14818136-5, dated Jul. 21, 2016, 9 pgs.
European Search Report, EP Patent Application No. EP16189052.0, dated Jan. 31, 2017, 11 pgs.
European Search Report, EP Patent Application No. EP16189319-3, dated Feb. 1, 2017, 9 pgs.
European Search Report, EP Patent Application No. EP14822971, dated Feb. 1, 2017, 9 pgs.
European Search Report, EP Patent Application No. EP16189987, dated Feb. 1, 2017, 8 pgs.
European Search Report, EP Patent Application No. 16196205.5, dated Mar. 28, 2017, 7 pgs.
European Search Report, EP Patent Application No. 16189300, dated Feb. 28, 2017, 4 pgs.
European Search Report, EP Patent Application No. 16189988.5, dated Mar. 1, 2017, 4 pgs.
European Search Report, EP Patent Application No. 16189982.8, dated Jan. 27, 2017, 9 pgs.
European Search Report, EP Patent Application No. 16189974, dated Mar. 2, 2017, 5 pgs.
European Search Report, EP Patent Application No. 16193743, dated Feb. 2, 2017, 5 pgs.
European Search Report, EP Patent Application No. 14868901.1, dated Jul. 7, 2017, 5 pgs.
European Search Report . EP15876036, dated May 3, 2018, 8 pgs.
European Search Report . EP16882597-4, dated Aug. 7, 2019, 9 pgs.
Supplemental European Search Report . EP15874273.4, dated May 11, 2018, 7 pgs.
Energous Corp., Supplementary European Search Report. EP15876033.0, dated Jun. 13, 2018, 10 pgs.
Energous Corp., Supplementary European Search Report. EP15876043.9, dated Aug. 8, 2018, 9 pgs.
Energous Corp. Supplementary European Search Report, EP18204043.6, dated Feb. 14, 2019, 5 pgs.
Energous Corp. Supplementary European Search Report, EP 16880153.8, dated Jul. 2, 2019, 9 pgs.
Energous Corp., Supplementary European Search Report. EP17840412.5, dated Jul. 15, 2019, 8 pgs.
Energous Corp., Supplementary European Search Report. EP16880139-7, dated Jul. 12, 2019, 5 pgs.
Energous Corp., Supplementary European Search Report. EP16880158-7, dated Jul. 15, 2019, 5 pgs.
Energous Corp., Supplementary European Search Report . EP16882696-4, dated Jul. 3, 2019, 10 pgs.
Energous Corp.,Extended European Search Report . EP17882087-4, dated Sep. 17, 2019, 10 pgs.
L.H. Hsieh et al. Development of a Retrodirective Wireless Microwave Power Transmission System, IEEE, 2003 pp. 393-396.
B.D. Van Veen et al., Beamforming: A Versatile Approach to Spatial Filtering, IEEE, ASSP Magazine, Apr. 1988, pp. 4-24.
Leabman, Adaptive Band-partitioning for Interference Cancellation in Communication System, Thesis Massachusetts Institute of Technology, Feb. 1997, pp. 1-70.
Panda, SIW based Slot Array Antenna and Power Management Circuit for Wireless Energy Harvesting Applications, IEEE APSURSI, Jul. 2012, 2 pgs.
Singh, Wireless Power Transfer Using Metamaterial Bonded Microstrip Antenna for Smart Grid WSN: In Fourth International Conference on Advances in Computing and Communications (ICACC), Aug. 27-29, 2014, Abstract 299.
T. Gill et al. "A System for Change Detection and Human Recognition in Voxel Space using the Microsoft Kinect Sensor," 2011 IEEE Applied Imagery Pattern Recognition Workshop. 8 pgs.
J. Han et al. Enhanced Computer Vision with Microsoft Kinect Sensor: A Review, IEEE Transactions on Cybernetics vol. 43, No. 5. pp. 1318-1334, Oct. 3, 2013.
Zhai, "A Practical wireless charging system based on ultra-wideband retro-reflective beamforming" 2010 IEEE Antennas and Propagation Society International Symposium, Toronto, ON 2010, pp. 1-4.
Mao: BeamStar: An Edge-Based Approach to Routing in Wireless Sensors Networks, IEEE Transactions on Mobile Computing, IEEE Service Center, Los Alamitos, CA US, vol. 6, No. 11, Nov. 1, 2007, 13 pgs.
Smolders—Institute of Electrical 1-15 and Electronics Engineers: "Broadband microstrip array antennas" Digest of the Antennas and Propagation Society International Symposium. Seattle, WA Jun. 19-24, 1994. Abstract 3 pgs.
Paolo Nenzi et al; "U-Helix: On-chip short conical antenna", 2013 7th European Conference on Antennas and Propagation (EUCAP), ISBN:978-1-4673-2187-7, IEEE, Apr. 8, 2013, 5 pgs.
Adamiuk G et al; "Compact, Dual-Polarized UWB-Antanna, Embedded in a Dielectric" IEEE Transactions on Antenna and Propagation, IEEE Service Center, Piscataway, NJ, US vol. 56, No. 2, ISSN: 0018-926X, abstract; Figure 1, Feb. 1, 2010, 8 pgs.
Mascarenas et al.; "Experimental Studies of Using Wireless Energy Transmission for Powering Embedded Sensor Nodes." Nov. 28, 2009, Journal of Sound and Vibration, pp. 2421-2433.
Li et al. High-Efficiency Switching-Mode Charger System Design Considerations with Dynamic Power Path Management, Mar./Apr. 2012 Issue, 8 pgs.

\* cited by examiner

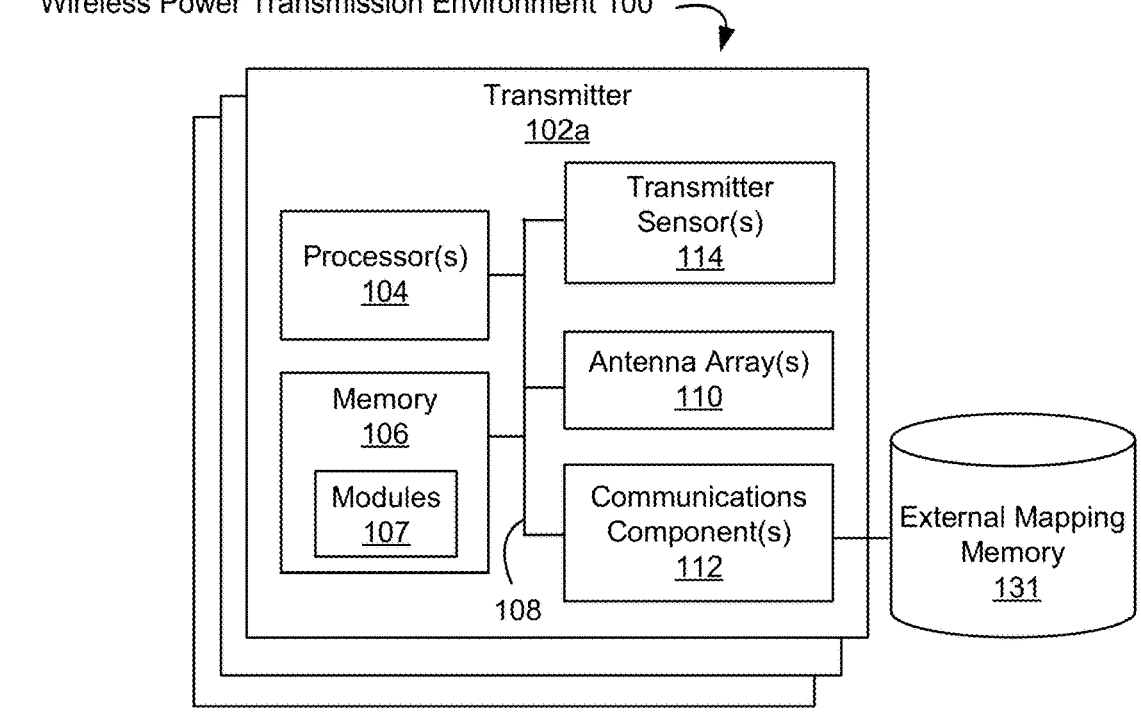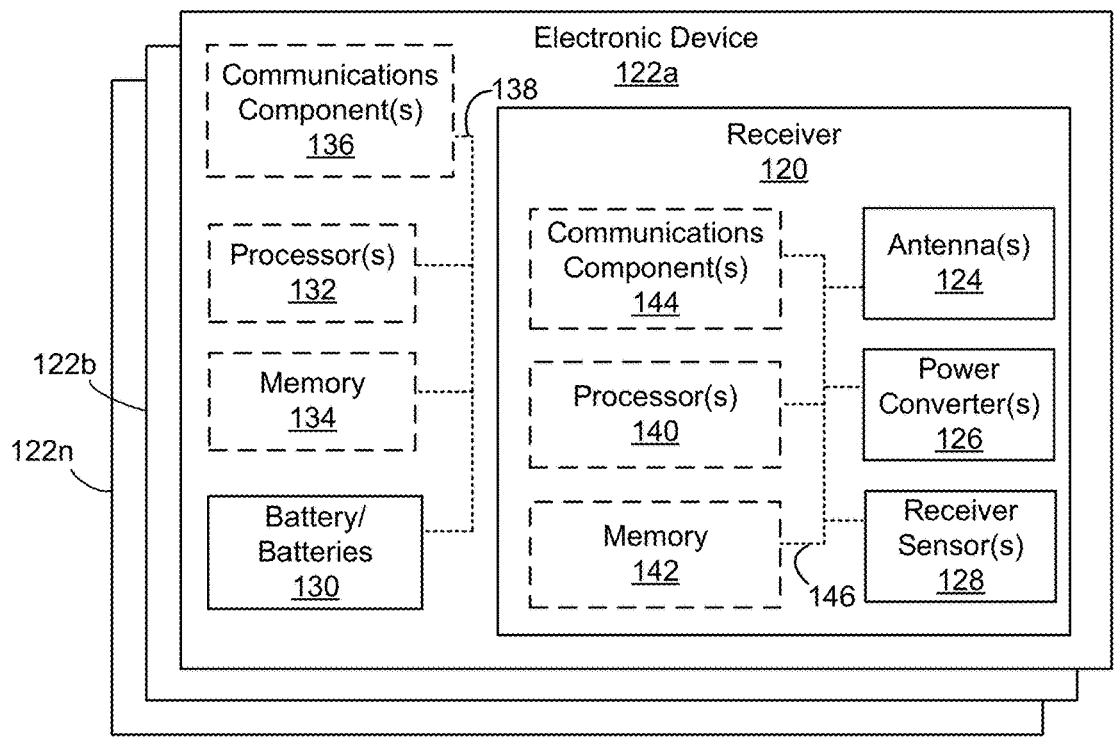
Figure 1

700

702-a
Form the first multi-layer PCB, wherein forming the first multi-layer PCB includes printing the first electrically conductive layer on the top and bottom surfaces of the first multi-layer PCB; and 702-b
form the second multi-layer PCB, wherein forming the second multi-layer PCB includes printing the second electrically conductive layer on the top and bottom surfaces of the second multi-layer PCB 704-a
Forming the first multi-layer PCB includes depositing a first heat-conductive material on an interior surface of at least a subset of the first plurality of vias, and 704-b
forming the second multi-layer PCB includes depositing a second heat-conductive material on an interior surface of at least a subset of the second plurality of vias 706-a
Depositing a first heat-conductive material on an interior surface of at least a subset of the first plurality of vias includes depositing the first heat-conductive material such that the first heat-conductive material is thermally coupled to the first electrically conductive material of the first multi-layer PCB; and 706-b
depositing a second heat-conductive material on an interior surface of at least a subset of the second plurality of vias includes depositing the second heat-conductive material such that the second heat-conductive material is thermally coupled to the second electrically conductive material of the second multi-layer PCB.

708
Form a dielectric assembly by coupling a dielectric slab to a first multi-layer printed circuit board (PCB) and a second multi-layer PCB, wherein:
708-a
the first multi-layer PCB includes a top surface and a bottom surface that is opposite the top surface, wherein:
the top and bottom surfaces of the first multi-layer PCB include a first electrically conductive material, and
a first plurality of vias each substantially pass through the top and bottom surfaces of the first multi-layer PCB; and
708-b
the second multi-layer PCB includes a top surface and a bottom surface that is opposite the top surface, wherein:
the top and bottom surfaces of the second multi-layer PCT include a second electrically conductive material, and
a second plurality of vias that each substantially pass through the top and bottom surfaces of the second multi-layer PCB

710
Coupling the dielectric slab to the first multi-layer PCB and the second multi-layer PCB includes: coupling the first multi-layer PCB to the dielectric slab using an adhesive; and coupling the second multi-layer PCB to the dielectric slab using the adhesive.

712
Coupling the dielectric slab to the first multi-layer PCB and the second multi layer PCB includes: arranging the first multi-layer PCB and the second multi-layer PCB relative to a dielectric material while it is in a liquid state, wherein the first multi-layer PCB and the second multi-layer PCB have fixed positions within the dielectric slab after the dielectric material of the dielectric slab transitions from the liquid state to a solid state.

714
Couple at least one feed to the dielectric assembly

716
Coupling the at least one feed to the dielectric assembly includes inserting the at least one feed into the dielectric assembly such that the at least one feed at least partially passes through at least one of: the first multi-layer PCB, the dielectric slab, or the second multi-layer PCB 718
The at least one feed substantially passes through the first multi-layer PCB, the second multi-layer PCB, and the dielectric slab

Figure 7C

MICROSTRIP ANTENNAS FOR WIRELESS POWER TRANSMITTERS

CROSS REFERENCE TO RELATED APPLICATIONS

This application is a continuation of U.S. patent application Ser. No. 15/414,464, filed on Jan. 24, 2017, entitled "Microstrip Antennas For Wireless Power Transmitters," which is hereby incorporated by reference in its entirety.

TECHNICAL FIELD

The disclosed embodiments relate generally to wireless power transmission systems, and in particular, to microstrip antennas for wirelessly transmitting and/or receiving power.

BACKGROUND

Portable electronic devices, such as laptop computers, mobile phones, tablets, and other electronic devices, require frequent charging of a power-storing component (e.g., a battery) to operate. Many electronic devices require charging one or more times per day. Often, charging an electronic device requires manually connecting an electronic device to an outlet or other power source using a wired charging cable. In some cases, the power-storing component is removed from an electronic device and inserted into charging equipment. Accordingly, charging is time consuming, burdensome, and inefficient because users must carry around multiple charging cables and/or other charging devices, and frequently must locate appropriate power sources to charge their electronic devices. Additionally, conventional charging techniques potentially deprive a user of the ability to use the device while it is charging, and/or require the user to remain next to a wall outlet or other power source to which their electronic device or other charging equipment is connected.

Additionally, existing patch antennas used for transmission of power waves have large cross-sectional areas, such as 6" by 6" for transmission of power waves at a frequency of 900 MHz. Due to these large cross-sectional areas, integrating these existing patch antennas with consumer electronic devices results in noticeable and undesired changes to an aesthetic appearance of the consumer electronic devices, thereby reducing the likelihood that consumers will be willing to install such devices in their homes, office spaces, and other areas.

SUMMARY

There is a need for improved antenna designs that help to address the shortcomings of conventional charging systems described above. In particular, there is a need for antennas (e.g., microstrip antennas) that have a form factor that is suitable for integration with consumer devices. The antennas described herein address these shortcomings and have a form factor that is suitable for integration with consumer devices. For example, in some embodiments the antennas discussed herein have a largest cross-sectional dimension of approximately two inches, making integration with consumer devices such as sound bars, televisions, media entertainment systems, light fixtures, portable air conditioning/heater systems, dashboard and glove compartments in automobiles, devices embedded in seat-backs (e.g., in trains, busses and airplanes), advertisement panels, and other consumer devices appropriate without impacting aesthetic appeal of these consumer devices, thereby ensuring that consumers will be more receptive to installing such transmitter devices (e.g., a sound bar with the novel microstrip antenna integrated therein) in their homes, offices, and other spaces.

In some embodiments, an antenna for use in a wireless power transmission system includes a first multi-layer printed circuit board (PCB) that includes a top surface and a bottom surface that is opposite the top surface, and the top and bottom surfaces of the first multi-layer PCB include a first electrically conductive material. The antenna additionally comprises a second multi-layer PCB that includes a top surface and a bottom surface that is opposite the top surface, and the top and bottom surfaces of the second multi-layer PCT include a second electrically conductive material. A first plurality of vias each substantially pass through the top and bottom surfaces of the first multi-layer PCB. A second plurality of vias each substantially pass through the top and bottom surfaces of the second multi-layer PCB. The antenna further includes a dielectric slab that is configured to receive the first multi-layer PCB and the second multi-layer PCB.

In some embodiments, a method for forming an antenna includes forming a dielectric assembly by coupling a dielectric slab to a first multi-layer PCB and a second multi-layer PCB. The first multi-layer PCB includes a top surface and a bottom surface that is opposite the top surface. The top and bottom surfaces of the first multi-layer PCB include a first electrically conductive material. A first plurality of vias each substantially pass through the top and bottom surfaces of the first multi-layer PCB. The second multi-layer PCB includes a top surface and a bottom surface that is opposite the top surface. The top and bottom surfaces of the second multi-layer PCT include a second electrically conductive material. A second plurality of vias each substantially pass through the top and bottom surfaces of the second multi-layer PCB. The method also includes coupling at least one feed to the dielectric assembly.

Note that the various embodiments described above can be combined with any other embodiments described herein. The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

FIG. 1 illustrates components of a wireless power transmission system, in accordance with some embodiments.

FIGS. 7A-7C are a flowchart representation of a method for forming an antenna, in accordance with some embodiments.

Figure 2:
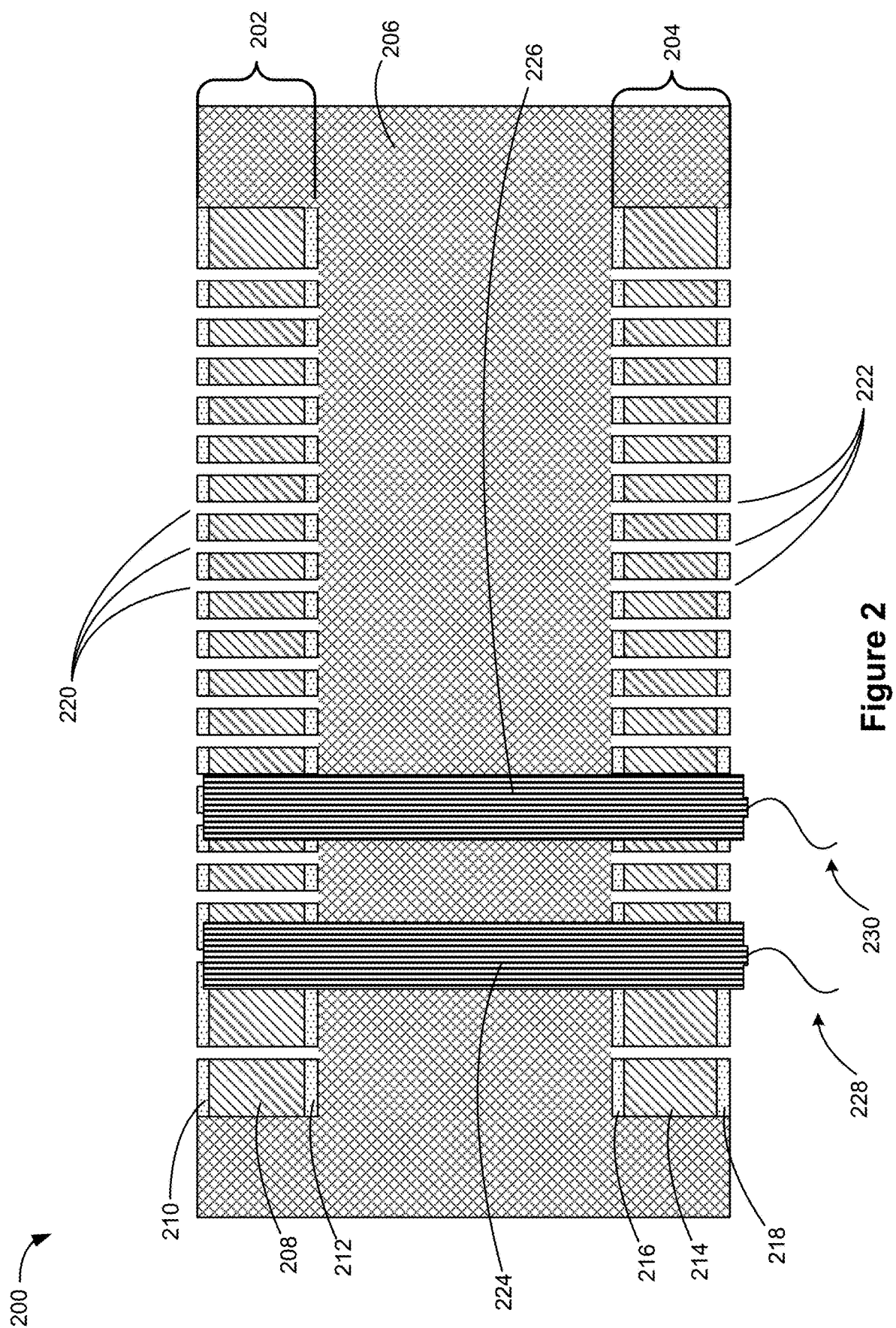
FIG. 2 illustrates a cross-sectional view of a microstrip antenna, in accordance with some embodiments.

In accordance with common practice, the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known processes, components, and materials have not been described in exhaustive detail so as not to unnecessarily obscure pertinent aspects of the embodiments described herein.

A microstrip antenna is described herein, which address the shortcomings described above in conventional charging systems and with existing antenna designs. In some embodiments, the microstrip antenna described herein is a component of a transmitter and/or a receiver of a wireless power transmission environment 100 (e.g., as described with regard to FIG. 1). For example, a microstrip antenna transmits power waves and/or receives transmitted power waves.

In some embodiments, one or more transmitters of a wireless power transmission environment generate power waves to form pockets of energy at target locations and adjust power wave generation based on sensed data to provide safe, reliable, and efficient wirelessly-delivered power to receivers (and devices associated therewith). In some embodiments, a controlled "pocket of energy" (e.g., a region in which available power is high due to constructive interference of power waves) and/or null spaces (e.g., a region in which available power is low or nonexistent due to destructive interference of power waves) may be formed by convergence of the power waves transmitted into a transmission field of the one or more transmitters. In some embodiments, the one or more transmitters include an array of the microstrip antennas described herein (e.g., in reference to FIGS. 2-7C), and the array of the microstrip antennas is used to transmit the power waves. For example, the antennas discussed herein may be integrated with consumer devices such as sound bars, televisions, media entertainment systems, light fixtures, and other consumer devices, to produce a respective transmitter that remains aesthetically appealing, yet still capable of transmitting power waves sufficient to charge other electronic devices (e.g., cell phones, smart watches, etc.).

In some embodiments, pockets of energy form at one or more locations in a two- or three-dimensional field due to patterns of constructive interference caused by convergences of transmitted power waves. Energy from the transmitted power waves may be harvested by receivers (i.e., received and converted into usable power) at the one or more locations.

In some embodiments, adaptive pocket-forming is performed, e.g., by adjusting power wave transmission to achieve a target power level for at least some of the power waves transmitted by the one or more transmitters. For example, a system for adaptive pocket-forming includes a sensor. In some embodiments, when the sensor detects an object, such as a sensitive object (e.g., a person, an animal, equipment sensitive to the power waves, and the like) within a predetermined distance (e.g., a distance within a range of 1-5 feet) of a pocket of energy, of one or more of the power waves, or of a transmitter, then a respective transmitter of the one or more transmitters adjusts one or more characteristics of transmitted power waves. Non-limiting examples of the one or more characteristics include: frequency, amplitude, trajectory, phase, and other characteristics used by one or more antennas of the one or more transmitters to transmit the power waves. As one example, in response to receiving information indicating that transmission of power waves by a respective transmitter of the one or more transmitters should be adjusted (e.g., a sensor senses a sensitive object within a predetermined distance of a respective target location), the adaptive pocket-forming process adjusts the one or more characteristics accordingly.

In some embodiments, adjusting the one or more characteristics includes reducing a currently generated power level at a location by adjusting one or more transmitted power waves that converge at the target location. In some embodiments, reducing a currently generated power level includes transmitting a power wave that causes destructive interference with at least one other transmitted power wave. For example, a power wave is transmitted with a first phase that is shifted relative to a second phase of at least one other power wave to destructively interfere with the at least one other power wave in order to diminish or eliminate the currently generated power level at the target location.

In some embodiments, adjusting the one or more characteristics includes increasing a power level for some of the transmitted power waves to ensure that the receiver receives adequate energy sufficient to quickly charge a power-storing component of an electronic device that is associated with the receiver.

In some embodiments, an object is "tagged" (e.g., an identifier of the object is stored in memory in association with a flag) to indicate that the detected object is a sensitive object. In response to detection of a particular object within a predetermined distance of a target location, a determination is made as to whether the particular object is a sensitive object. In some embodiments, this determination includes performing a lookup in the memory to check whether the particular object has been previously tagged and is therefore known as a sensitive object. In response to determining that the particular object is a sensitive object, the one or more characteristics used to transmit the power waves are adjusted accordingly.

In some embodiments, sensing a sensitive object includes using a series of sensor readings from one or more sensors to determine motion of an object within a transmission field of the one or more transmitters. In some embodiments, sensor output from one or more sensors is used to detect motion of the object approaching within a predetermined distance of a pocket of energy or of power waves used to form the pocket of energy. In response to a determination that a sensitive object is approaching (e.g., moving toward and/or within a predefined distance of a pocket of energy), the currently generated power level at the location of the pocket of energy is reduced. In some embodiments, the one or more sensors include sensors that are internal to the one or more transmitters and/or the receiver. In some embodiments, the one or more sensors include sensors that are external to the one or more transmitters and the receiver. In some embodiments, the one or more sensors include thermal imaging, optical, radar, and other types of sensors capable of detecting objects within a transmission field.

Although some embodiments herein include the use of RF-based wave transmission technologies as a primary example, it should be appreciated that the wireless charging techniques that might be employed are not be limited to RF-based technologies and transmission techniques. Rather, it should be appreciated that additional or alternative wireless charging techniques may be utilized, including any suitable technology and technique for wirelessly transmitting energy so that a receiver is capable of converting the transmitted energy to electrical power. Such technologies or techniques may transmit various forms of wirelessly transmitted energy including the following non-limiting examples: ultrasound, microwave, laser light, infrared, or other forms of electromagnetic energy.

FIG. 1 is a block diagram of components of wireless power transmission environment 100, in accordance with some embodiments. Wireless power transmission environment 100 includes, for example, transmitters 102 (e.g., transmitters 102a, 102b . . . 102n) and one or more receivers 120 (e.g., receivers 120a, 120b . . . 120n). In some embodiments, each respective wireless power transmission environment 100 includes a number of receivers 120, each of which is associated with a respective electronic device 122.

An example transmitter 102 (e.g., transmitter 102a) includes, for example, one or more processor(s) 104, a memory 106, one or more antenna arrays 110 (e.g., including antenna elements structured as described below in reference to FIGS. 2-7C), and one or more communications components 112, and/or one or more transmitter sensors 114. In some embodiments, these components are interconnected by way of a communications bus 108. References to these components of transmitters 102 cover embodiments in which one or more than one of each of these components (and combinations thereof) are included.

In some embodiments, memory 106 stores one or more programs (e.g., sets of instructions) and/or data structures, collectively referred to as "modules" herein. In some embodiments, memory 106, or the non-transitory computer readable storage medium of memory 106 stores the following modules 107 (e.g., programs and/or data structures), or a subset or superset thereof:

information received from receiver 120 (e.g., generated by receiver sensor 128 and then transmitted to the transmitter 102a);

information received from transmitter sensor 114;

an adaptive pocket-forming module that adjusts one or more power waves transmitted by one or more transmitters 102; and/or a beacon transmitting module that transmits a communication signal 118 for detecting a receiver 120 (e.g., within a transmission field of the one or more transmitters 102).

The above-identified modules (e.g., data structures and/or programs including sets of instructions) need not be implemented as separate software programs, procedures, or modules, and thus various subsets of these modules may be combined or otherwise re-arranged in various embodiments. In some embodiments, memory 106 stores a subset of the modules identified above. In some embodiments, an external mapping memory 131 that is communicatively connected to communications component 112 stores one or more modules identified above. Furthermore, the memory 106 and/or external mapping memory 131 may store additional modules not described above. In some embodiments, the modules stored in memory 106, or a non-transitory computer readable storage medium of memory 106, provide instructions for implementing respective operations in the methods described below. In some embodiments, some or all of these modules may be implemented with specialized hardware circuits that subsume part or all of the module functionality. One or more of the above-identified elements may be executed by one or more of processor(s) 104. In some embodiments, one or more of the modules described with regard to memory 106 is implemented on memory 104 of a server (not shown) that is communicatively coupled to one or more transmitters 102 and/or by a memory of electronic device 122 and/or receiver 120.

In some embodiments, a single processor 104 (e.g., processor 104 of transmitter 102a) executes software modules for controlling multiple transmitters 102 (e.g., transmitters 102b . . . 102n). In some embodiments, a single transmitter 102 (e.g., transmitter 102a) includes multiple processors 104, such as one or more transmitter processors (configured to, e.g., control transmission of signals 116 by antenna array 110), one or more communications component processors (configured to, e.g., control communications transmitted by communications component 112 and/or receive communications by way of communications component 112) and/or one or more sensor processors (configured to, e.g., control operation of transmitter sensor 114 and/or receive output from transmitter sensor 114).

Receiver 120 (e.g., a receiver of electronic device 122) receives power signals 116 and/or communications 118 transmitted by transmitters 102. In some embodiments, receiver 120 includes one or more antennas 124 (e.g., antenna array including multiple antenna elements), power converter 126, receiver sensor 128 and/or other components or circuitry (e.g., processor(s) 140, memory 142, and/or communication component(s) 144). In some embodiments, these components are interconnected by way of a communications bus 143. References to these components of receiver 120 cover embodiments in which one or more than one of each of these components (and combinations thereof) are included. Receiver 120 converts energy from received signals 116 (e.g., power waves) into electrical energy to power and/or charge electronic device 122. For example, receiver 120 uses power converter 126 to convert captured energy from power waves 116 to alternating current (AC) electricity or direct current (DC) electricity usable to power and/or charge electronic device 122. Non-limiting examples of power converter 126 include rectifiers, rectifying circuits, voltage conditioners, among suitable circuitry and devices.

In some embodiments, receiver 120 is a standalone device that is detachably coupled to one or more electronic devices 122. For example, electronic device 122 has processor(s) 132 for controlling one or more functions of electronic device 122 and receiver 120 has processor(s) 140 for controlling one or more functions of receiver 120.

In some embodiments, receiver is a component of electronic device 122. For example, processor(s) 132 controls functions of electronic device 122 and receiver 120.

In some embodiments, electronic device 122 includes processor(s) 132, memory 134, communication component(s) 136, and/or battery/batteries 130. In some embodiments, these components are interconnected by way of a communications bus 138. In some embodiments, communications between electronic device 122 and receiver 120 occur via communications component(s) 136 and/or 144. In some embodiments, communications between electronic device 122 and receiver 120 occur via a wired connection between communications bus 138 and communications bus 146. In some embodiments, electronic device 122 and receiver 120 share a single communications bus.

In some embodiments, receiver 120 receives one or more power waves 116 directly from transmitter 102. In some embodiments, receiver 120 harvests power waves from one or more pockets of energy created by one or more power waves 116 transmitted by transmitter 102.

In some embodiments, after the power waves 116 are received and/or energy is harvested from a pocket of energy, circuitry (e.g., integrated circuits, amplifiers, rectifiers, and/or voltage conditioner) of the receiver 120 converts the energy of the power waves (e.g., radio frequency electromagnetic radiation) to usable power (i.e., electricity), which powers electronic device 122 and/or is stored to battery 130 of electronic device 122. In some embodiments, a rectifying circuit of the receiver 120 translates the electrical energy from AC to DC for use by electronic device 122. In some embodiments, a voltage conditioning circuit increases or decreases the voltage of the electrical energy as required by the electronic device 122. In some embodiments, an electrical relay conveys electrical energy from the receiver 120 to the electronic device 122.

In some embodiments, receiver 120 is a component of an electronic device 122. In some embodiments, a receiver 120 is coupled (e.g., detachably coupled) to an electronic device 122. In some embodiments, electronic device 122 is a peripheral device of receiver 120. In some embodiments, electronic device 122 obtains power from multiple transmitters 102 and/or using multiple receivers 120. In some embodiments, the wireless power transmission environment 100 includes a plurality of electronic devices 122, each having at least one respective receiver 120 that is used to harvest power waves from the transmitters 102 into usable power for charging the electronic devices 122.

In some embodiments, the one or more transmitters 102 adjust one or more characteristics (e.g., phase, gain, direction, and/or frequency) of power waves 116. For example, a transmitter 102 (e.g., transmitter 102a) selects a subset of one or more antenna elements of antenna array 110 to initiate transmission of power waves 116, cease transmission of power waves 116, and/or adjust one or more characteristics used to transmit power waves 116. In some implementations, the one or more transmitters 102 adjust power waves 116 such that trajectories of power waves 116 converge at a predetermined location within a transmission field (e.g., a location or region in space), resulting in controlled constructive or destructive interference patterns.

In some embodiments, respective antenna arrays 110 of the one or more transmitters 102 may include a set of one or more antennas configured to transmit the power waves 116 into respective transmission fields of the one or more transmitters 102. Integrated circuits (not shown) of the respective transmitter 102, such as a controller circuit and/or waveform generator, may control the behavior of the antennas. For example, based on the information received from the receiver by way of the communications signal 118, a controller circuit may determine a set of one or more characteristics or waveform characteristics (e.g., amplitude, frequency, trajectory, phase, among other characteristics) used for transmitting the power waves 116 that would effectively provide power to the receiver 102 and electronic device 122. The controller circuit may also identify a subset of antennas from the antenna arrays 110 that would be effective in transmitting the power waves 116. As another example, a waveform generator circuit of the respective transmitter 102 coupled to the processor 104 may convert energy and generate the power waves 116 having the waveform characteristics identified by the controller, and then provide the power waves to the antenna arrays 110 for transmission.

In some embodiments, constructive interference of power waves occurs when two or more power waves 116 are in phase with each other and converge into a combined wave such that an amplitude of the combined wave is greater than amplitude of a single one of the power waves. For example, the positive and negative peaks of sinusoidal waveforms arriving at a location from multiple antennas "add together" to create larger positive and negative peaks. In some embodiments, a pocket of energy is formed at a location in a transmission field where constructive interference of power waves occurs.

In some embodiments, destructive interference of power waves occurs when two or more power waves are out of phase and converge into a combined wave such that the amplitude of the combined wave is less than the amplitude of a single one of the power waves. For example, the power waves "cancel each other out," thereby diminishing the amount of energy concentrated at a location in the transmission field. In some embodiments, destructive interference is used to generate a negligible amount of energy or "null" at a location within the transmission field where the power waves converge.

In some embodiments, the one or more transmitters 102 transmit power waves 116 that create two or more discrete transmission fields (e.g., overlapping and/or non-overlapping discrete transmission fields). In some embodiments, a first transmission field is managed by a first processor 104 of a first transmitter (e.g. transmitter 102a) and a second transmission field is managed by a second processor 104 of a second transmitter (e.g., transmitter 102b). In some embodiments, the two or more discrete transmission fields (e.g., overlapping and/or non-overlapping) are managed by the transmitter processors 104 as a single transmission field.

In some embodiments, communications component 112 transmits communication signals 118 by way of a wired and/or wireless communication connection to receiver 120. In some embodiments, communications component 112 generates communications signals 118 used for triangulation of receiver 120. In some embodiments, communication signals 118 are used to convey information between transmitter 102 and receiver 120 for adjusting one or more characteristics used to transmit the power waves 116. In some embodiments, communications signals 118 include information related to status, efficiency, user data, power consumption, billing, geo-location, and other types of information.

In some embodiments, receiver 120 includes a transmitter (not shown), or is a part of a transceiver, that transmits communications signals 118 to communications component 112 of transmitter 102.

In some embodiments, communications component 112 (e.g., communications component 112 of transmitter 102a) includes a communications component antenna for communicating with receiver 120 and/or other transmitters 102 (e.g., transmitters 102b through 102n). In some embodiments, these communications signals 118 represent a distinct channel of signals transmitted by transmitter 102, independent from a channel of signals used for transmission of the power waves 116.

In some embodiments, the receiver 120 includes a receiver-side communications component (not shown) configured to communicate various types of data with one or more of the transmitters 102, through a respective communications signal 118 generated by the receiver-side communications component. The data may include location indicators for the receiver 102 and/or electronic device 122, a power status of the device 122, status information for the receiver 102, status information for the electronic device 122, status information about the power waves 116, and/or status information for pockets of energy. In other words, the receiver 102 may provide data to the transmitter 102, by way of the communications signal 118, regarding the current operation of the system 100, including: information identifying a present location of the receiver 102 or the device 122, an amount of energy received by the receiver 120, and an amount of power received and/or used by the electronic device 122, among other possible data points containing other types of information.

In some embodiments, the data contained within communications signals 118 is used by electronic device 122, receiver 120, and/or transmitters 102 for determining adjustments of the one or more characteristics used by the antenna array 110 to transmit the power waves 106. Using a communications signal 118, the transmitter 102 communicates data that is used, e.g., to identify receivers 120 within a transmission field, identify electronic devices 122, determine safe and effective waveform characteristics for power waves, and/or hone the placement of pockets of energy. In some embodiments, receiver 120 uses a communications signal 118 to communicate data for, e.g., alerting transmitters 102 that the receiver 120 has entered or is about to enter a transmission field, provide information about electronic device 122, provide user information that corresponds to electronic device 122, indicate the effectiveness of received power waves 116, and/or provide updated characteristics or transmission parameters that the one or more transmitters 102 use to adjust transmission of the power waves 116.

As an example, the communications component 112 of the transmitter 102 communicates (e.g., transmits and/or receives) one or more types of data (including, e.g., authentication data and/or transmission parameters) including various information such as a beacon message, a transmitter identifier, a device identifier for an electronic device 122, a user identifier, a charge level for electronic device 122, a location of receiver 120 in a transmission field, and/or a location of electronic device 122 in a transmission field.

In some embodiments, transmitter sensor 114 and/or receiver sensor 128 detect and/or identify conditions of electronic device 122, receiver 120, transmitter 102, and/or a transmission field. In some embodiments, data generated by transmitter sensor 114 and/or receiver sensor 128 is used by transmitter 102 to determine appropriate adjustments to the one or more characteristics used to transmit the power waves 106. Data from transmitter sensor 114 and/or receiver sensor 128 received by transmitter 102 includes, e.g., raw sensor data and/or sensor data processed by a processor 104, such as a sensor processor. Processed sensor data includes, e.g., determinations based upon sensor data output. In some embodiments, sensor data received from sensors that are external to the receiver 120 and the transmitters 102 is also used (such as thermal imaging data, information from optical sensors, and others).

In some embodiments, receiver sensor 128 is a gyroscope that provides raw data such as orientation data (e.g., tri-axial orientation data), and processing this raw data may include determining a location of receiver 120 and/or a location of receiver antenna 124 using the orientation data.

In some embodiments, receiver sensor 128 includes one or more infrared sensors (e.g., that output thermal imaging information), and processing this infrared sensor data includes identifying a person (e.g., indicating presence of the person and/or indicating an identification of the person) or other sensitive object based upon the thermal imaging information.

In some embodiments, receiver sensor 128 includes a gyroscope and/or an accelerometer that indicates an orientation of receiver 120 and/or electronic device 122. As one example, transmitters 102 receive orientation information from receiver sensor 128 and the transmitters 102 (or a component thereof, such as the processor 104) use the received orientation information to determine whether electronic device 122 is flat on a table, in motion, and/or in use (e.g., next to a user's head).

In some embodiments, receiver sensor 128 is a sensor of electronic device 122 (e.g., an electronic device 122 that is remote from receiver 102). In some embodiments, receiver 120 and/or electronic device 122 includes a communication system for transmitting signals (e.g., sensor signals output by receiver sensor 128) to transmitter 102.

Non-limiting examples of transmitter sensor 114 and/or receiver sensor 128 include, e.g., infrared, pyroelectric, ultrasonic, laser, optical, Doppler, gyro, accelerometer, microwave, millimeter, RF standing-wave sensors, resonant LC sensors, capacitive sensors, and/or inductive sensors. In some embodiments, technologies for transmitter sensor 114 and/or receiver sensor 128 include binary sensors that acquire stereoscopic sensor data, such as the location of a human or other sensitive object.

In some embodiments, transmitter sensor 114 and/or receiver sensor 128 is configured for human recognition (e.g., capable of distinguishing between a person and other objects, such as furniture). Examples of sensor data output by human recognition-enabled sensors include: body temperature data, infrared range-finder data, motion data, activity recognition data, silhouette detection and recognition data, gesture data, heart rate data, portable devices data, and wearable device data (e.g., biometric readings and output, accelerometer data).

In some embodiments, transmitters 102 adjust one or more characteristics used to transmit the power waves 116 to ensure compliance with electromagnetic field (EMF) exposure protection standards for human subjects. Maximum exposure limits are defined by US and European standards in terms of power density limits and electric field limits (as well as magnetic field limits). These include, for example, limits established by the Federal Communications Commission (FCC) for maximum permissible exposure (MPE), and limits established by European regulators for radiation exposure. Limits established by the FCC for MPE are codified at 47 CFR § 1.1310. For electromagnetic field (EMF) frequencies in the microwave range, power density can be used to express an intensity of exposure. Power density is defined as power per unit area. For example, power density can be commonly expressed in terms of watts per square meter ($W/m^2$), milliwatts per square centimeter ($mW/cm^2$), or microwatts per square centimeter ($\mu W/cm^2$). In some embodiments, output from transmitter sensor 114 and/or receiver sensor 128 is used by transmitter 102 to detect whether a person or other sensitive object enters a power transmission region (e.g., a location within a predetermined distance of a transmitter 102, power waves generated by transmitter 102, and/or a pocket of energy). In some embodiments, in response to detecting that a person or other sensitive object has entered the power transmission region, the transmitter 102 adjusts one or more power waves 116 (e.g., by ceasing power wave transmission, reducing power wave transmission, and/or adjusting the one or more characteristics of the power waves). In some embodiments, in response to detecting that a person or other sensitive object has entered the power transmission region, the transmitter 102 activates an alarm (e.g., by transmitting a signal to a loudspeaker that is a component of transmitter 102 or to an alarm device that is remote from transmitter 102). In some embodiments, in response to detecting that a person or other sensitive object has entered a power transmission region, the transmitter 102 transmits a digital message to a system log or administrative computing device.

In some embodiments, antenna array 110 includes multiple antenna elements (e.g., configurable "tiles") collectively forming an antenna array. Antenna array 110 generates power transmission signals, e.g., RF power waves, ultrasonic power waves, infrared power waves, and/or magnetic resonance power waves. In some embodiments, the antennas of an antenna array 110 (e.g., of a single transmitter, such as transmitter 102a, and/or of multiple transmitters, such as transmitters 102a, 102b, . . . , 102n) transmit two or more power waves that intersect at a defined location (e.g., a location corresponding to a detected location of a receiver 120), thereby forming a pocket of energy (e.g., a concentration of energy) at the defined location.

In some embodiments, transmitter 102 assigns a first task to a first subset of antenna elements of antenna array 110, a second task to a second subset of antenna elements of antenna array 110, and so on, such that the constituent antennas of antenna array 110 perform different tasks (e.g., determining locations of previously undetected receivers 120 and/or transmitting power waves 116 to one or more receivers 120). As one example, in an antenna array 110 with ten antennas, nine antennas transmit power waves 116 that form a pocket of energy and the tenth antenna operates in conjunction with communications component 112 to identify new receivers in the transmission field. In another example, an antenna array 110 having ten antenna elements is split into two groups of five antenna elements, each of which transmits power waves 116 to two different receivers 120 in the transmission field.

In some embodiments, a microstrip antenna 200 (of FIG. 2) is an antenna element of antenna array 110 of transmitter 102. In some embodiments, a microstrip antenna 200 is an antenna element of antenna 124 of receiver 120. Microstrip antenna 200 transmits and/or receives electromagnetic waves.

FIG. 2 illustrates a cross-sectional view of a microstrip antenna 200, in accordance with some embodiments. In some embodiments, the microstrip antenna 200 includes a first multi-layer printed circuit board (PCB) 202, a second multi-layer PCB 204, and a dielectric slab 206. In some embodiments, the first multi-layer PCB 202 includes first PCB 208. In some embodiments, the first PCB 208 includes electrically conductive material at the top side of first PCB 208 (e.g., a first layer 210 of the electrically conductive material) and at the bottom side of first PCB 208 (e.g., a second layer 212 of the electrically conductive material). In some embodiments, the second multi-layer PCB 204 includes second PCB 214. In some embodiments, the second PCB 214 includes electrically conductive material at the top side of second PCB 214 (e.g., a first layer 216 of the electrically conductive material) and at the bottom side of second PCB 214 (e.g., a second layer 218 of the electrically conductive material). In some embodiments, the electrically conductive material is a metal, for example, copper, silver, gold, aluminum, and/or brass. In some embodiments, the electrically conductive material is laminated on tops and/or bottoms of the PCBs 208 and 214 during manufacture of the first multi-layer PCB 202 and the second multi-layer PCB 204.

In some embodiments, a first set of vias 220 each pass through the first multi-layer PCB 202. In some embodiments, a second set of vias 222 each pass through the second multi-layer PCB 204.

In some embodiments, a first feed 224 passes at least partially through second multi-layer PCB 204, dielectric slab 206, and first multi-layer PCB 202. In some embodiments, a second feed 226 passes at least partially through second multi-layer PCB 204, dielectric slab 206, and first multi-layer PCB 202. For example, a microstrip antenna 200 that is a dual-polarized antenna includes two feeds (e.g., first feed 224 to transmit and/or receive horizontally polarized waves and second feed 226 to transmit and/or receive vertically polarized waves). In some embodiments, a microstrip antenna 200 that is a single-polarized antenna includes only a single feed (e.g., first feed 224). First feed 224 and second feed 226 are, for example, metallic pins.

In some embodiments, a first signal (e.g., a first RF power wave) is provided to first feed 224 via a first cable 228. In some embodiments, first feed 224 excites the microstrip antenna 200 using the first signal for transmission of RF power waves by the microstrip antenna 200. In some embodiments, a second signal (e.g., a second RF power wave) is provided to second feed 226 via a second cable 230. In some embodiments, second feed 226 excites the microstrip antenna 200 using the second signal for transmission of RF power waves by the microstrip antenna 200. In some embodiments, first cable 228 and/or second cable 230 are coupled to an output of processor(s) 104 of transmitter 102a (processor(s) 102 and transmitter 102a are discussed in detail above in reference to FIG. 1).

Having a single microstrip antenna with two multi-layer PCBs at opposite ends of a dielectric slab helps to improve manufacturability of antennas. For example, in some embodiments, electrically conductive material is printed on PCBs 208 and 214 using established PCB printing techniques. In some embodiments, any desired slab of material is usable as a substrate (e.g., dielectric substrate 206) to which multi-layer PCBs are attached.

Figure 3:
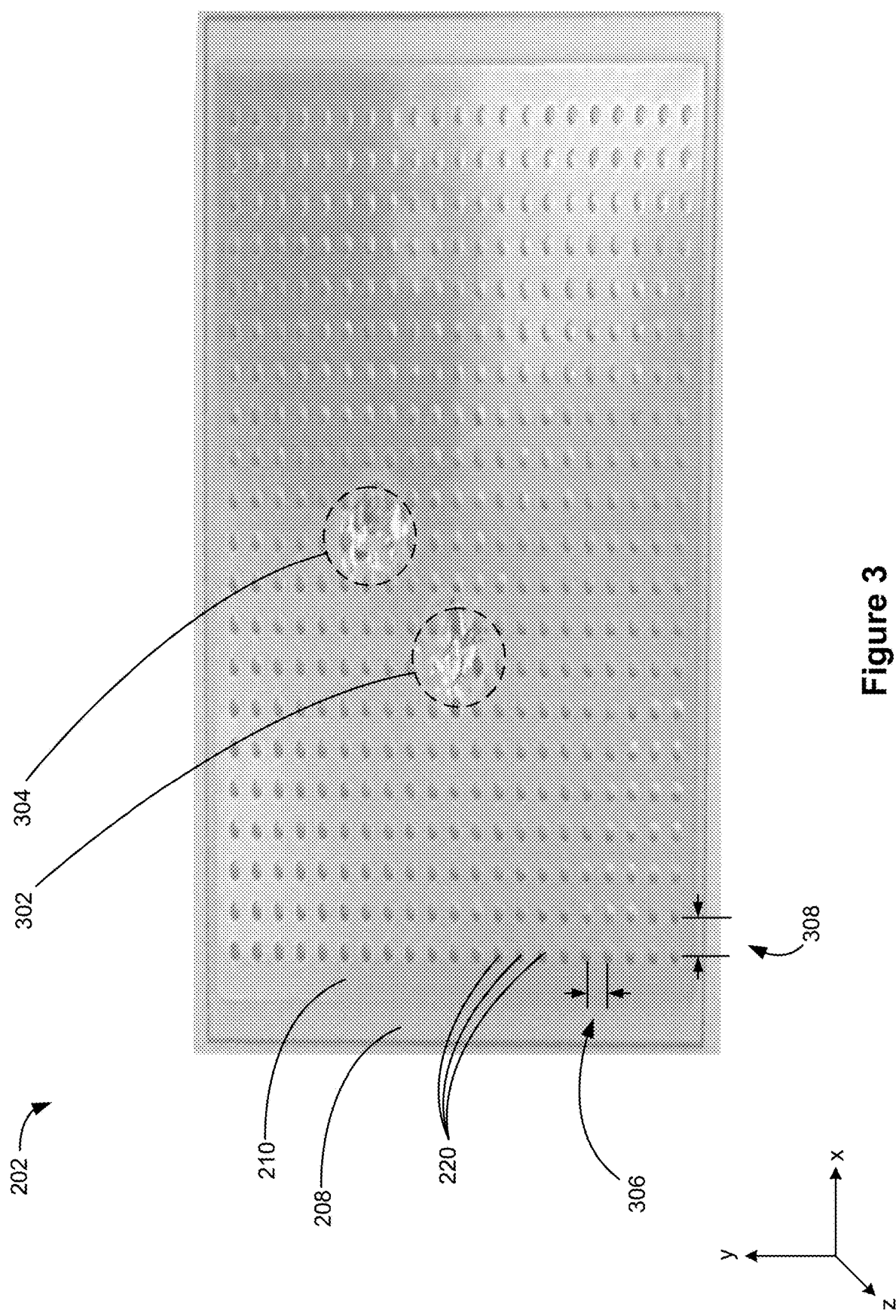
FIG. 3 illustrates a top view of a multi-layer PCB, in accordance with some embodiments.

FIG. 3 illustrates a top view of a first multi-layer PCB 202, in accordance with some embodiments. An electrically conductive material (e.g., layer 210) is shown at the top of first PCB 208. FIG. 3 illustrates an embodiment in which first feed 224 and second feed 226 partially puncture first PCB 208, causing distortion of the top surface of first PCB 208. Distortion regions 302 and 304 show locations of first feed 224 and second feed 226, respectively, within the first multi-layer PCB 202.

A first set of vias 220 pass through the first multi-layer PCB 202. In some embodiments, a y-axis distance 306 between vias of the plurality of vias 220 and/or an x-axis distance 308 between vias of the plurality of vias 220 is much smaller than a wavelength $\lambda$ that corresponds to a target frequency (e.g., 900 MHz) for transmission and/or reception by microstrip antenna 200. Additionally, the microstrip antenna 200 (of which PCB 202 is a component) also has a maximum cross-sectional dimension which is much smaller than this wavelength (as discussed below in reference to FIG. 4). For example, in some embodiments, y-axis distance 306 and/or x-axis distance 308 (or the maximum cross-sectional dimension of the microstrip antenna 200) is equal to or less than λ/0 (e.g., λ/20). In some embodiments, y-axis distance 306 and/or x-axis distance 308 is 2.0 mm. In some embodiments, a diameter of a respective via of the plurality of vias 220 is less than or equal to 2.0 mm (e.g., 1.0 mm).

Figure 4:
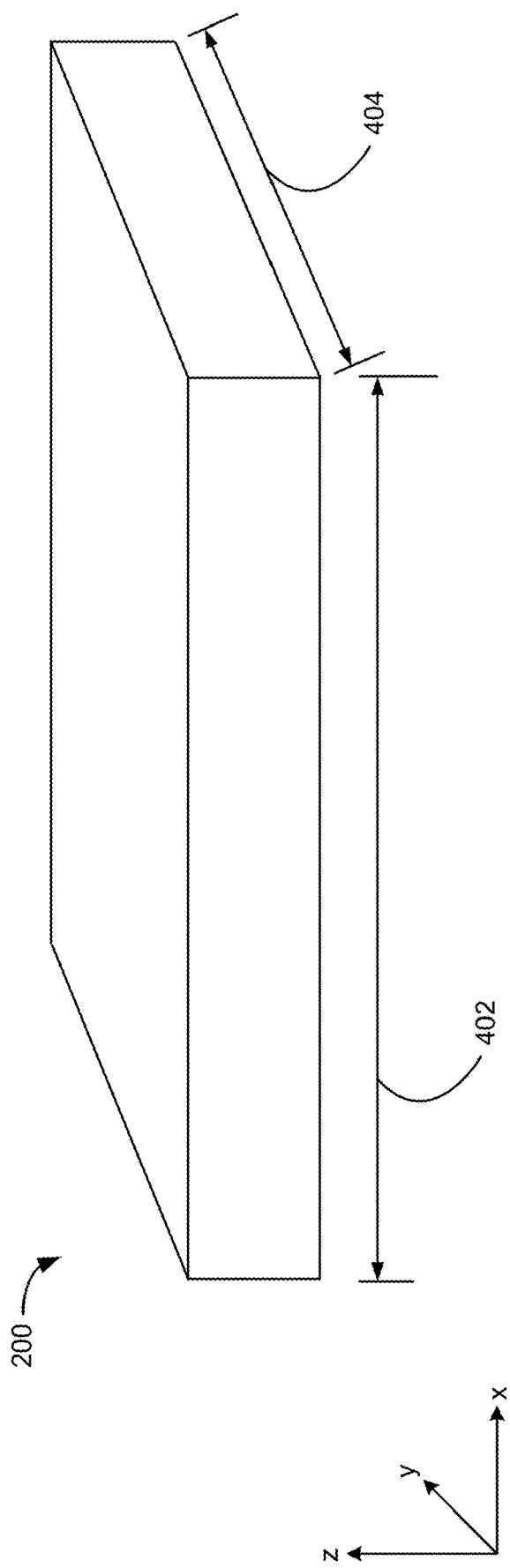
FIG. 4 is used to illustrate dimensions of a microstrip antenna, in accordance with some embodiments.

FIG. 4 illustrates an x-axis dimension 402 and a y-axis dimension 404 of microstrip antenna 200, in accordance with some embodiments. In some embodiments, one or more dimensions of microstrip antenna 200 are determined based on a target bandwidth. For example, in some embodiments, x-axis dimension 402 and/or y-axis dimension 404 is/are much smaller than a wavelength λ that corresponds to a target frequency (e.g., 900 MHz) of power waves transmitted by the microstrip antenna 200. In some embodiments, the microstrip antenna 200 has an x-axis dimension 402 of less than or equal to 50.8 mm (e.g., 40 mm). In some embodiments, the microstrip antenna 200 has a y-axis dimension 404 of less than or equal to 50.8 mm (e.g., 30 mm). For example, in some embodiments, the microstrip antenna 200 has an x-axis dimension 402 of 25.4 mm and a y-axis dimension 404 of 25.4 mm.

Figure 5:
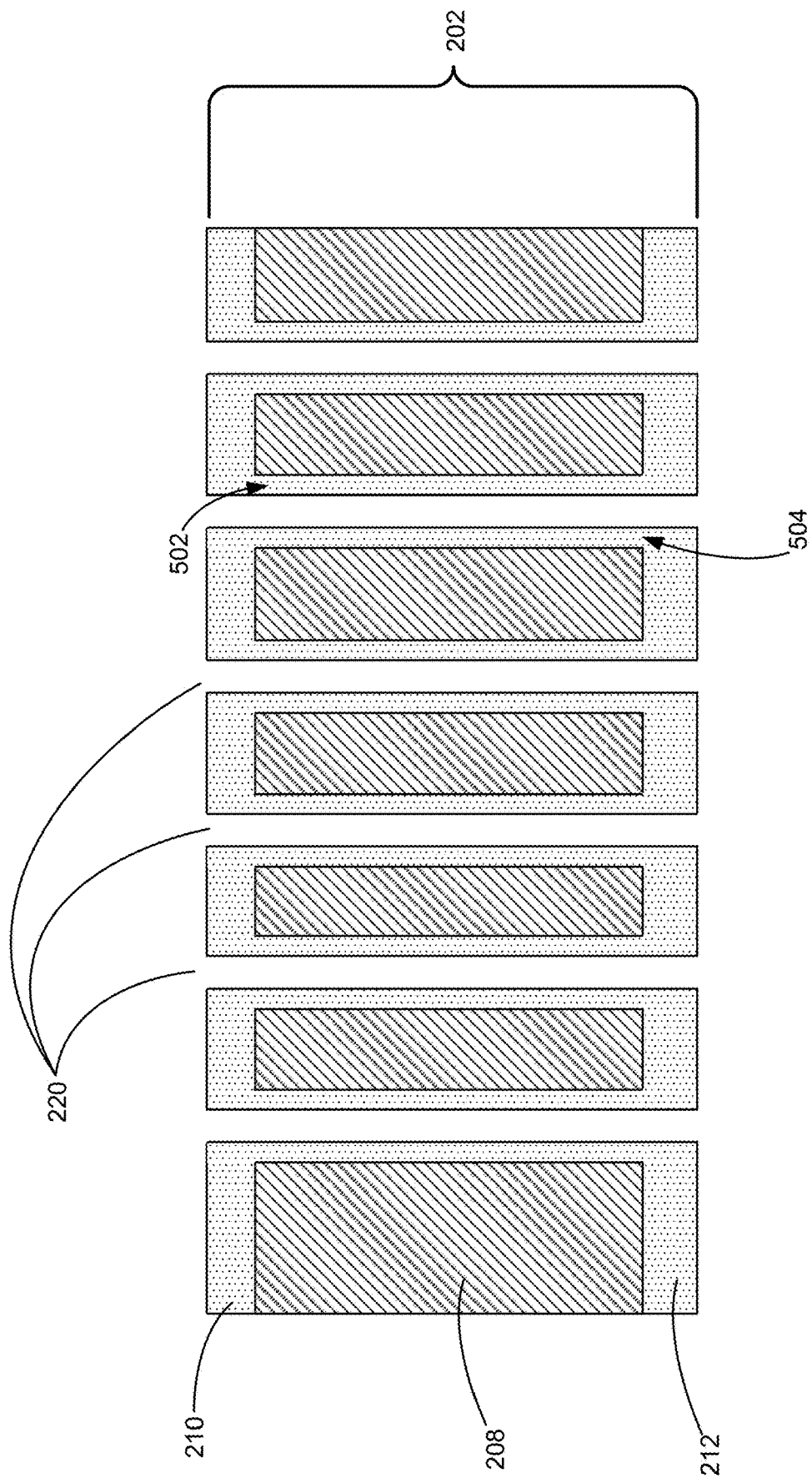
FIG. 5 is an expanded view of a multi-layer PCB that illustrates a material formed on the interior surfaces of vias, in accordance with some embodiments.

FIG. 5 is an expanded cross-sectional view of first multi-layer PCB 202 that illustrates a material formed on an interior surface of at least a subset of vias of the plurality of vias 220, in accordance with some embodiments. In some embodiments, a via-coating material (e.g., via-coating material 502 and 504) is formed on an interior surface of one or more vias (e.g., an interior surface of each via) of the plurality of vias 220. For example, the interior surface of one or more vias is plated with the via-coating material. In some embodiments, the via-coating material is a heat-conducting material and/or an electrically-conductive material. In some embodiments, the via-coating material is conductively coupled to a first electrically conductive material (e.g., electrically conductive material 210 as shown at the top of first PCB 208 and/or electrically conductive material 212 as shown at the bottom of first PCB 208). For example, the via-coating material is conductively coupled to a first electrically conductive material such that heat and/or electrons are conducted between electrically conductive layer 210, the via-coating material, and electrically conductive layer 212. In some embodiments, via-coating material is conductively coupled to a second electrically conductive material (e.g., electrically conductive material 216 as shown at the top of second PCB 214 and/or electrically conductive material 218 as shown at the bottom of second PCB 214). In some embodiments, the via-coating material and the electrically conductive material (e.g., first electrically conductive material and/or second electrically conductive material) are the same material.

Figure 6:
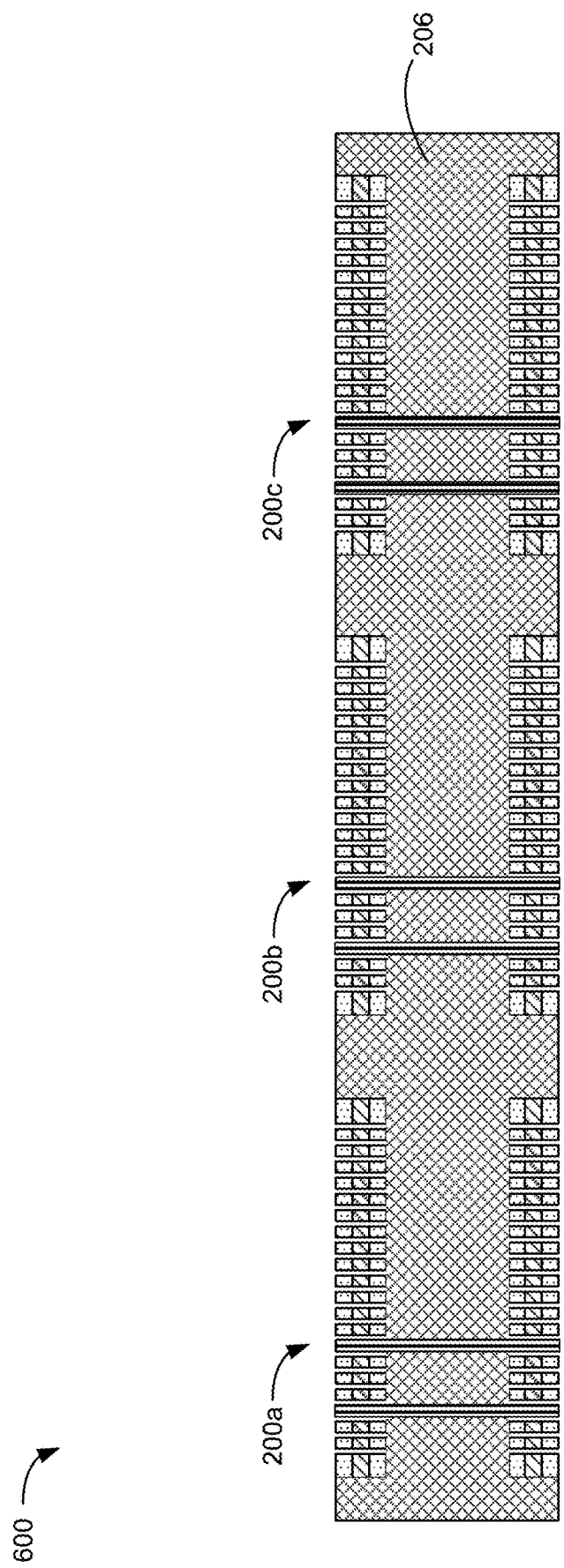
FIG. 6 illustrates an array of microstrip antennas, in accordance with some embodiments.

FIG. 6 illustrates an array 600 of microstrip antennas, in accordance with some embodiments. In some embodiments, array 600 is used as an antenna array 110 of a transmitter 102 within a wireless power transmission environment 100 as illustrated in FIG. 1 and described above. Array 600 includes a plurality of component antennas, such as multiple microstrip antennas 200 (e.g., first microstrip antenna 200a, second microstrip antenna 200b, and third microstrip antenna 200c). Although three microstrip antennas are shown in FIG. 6, it will be recognized that other numbers of antennas may be included in array 600, e.g., 2-10 antennas.

In some embodiments, formation of array 600 includes arranging the respective multi-layer PCBs of microstrip antennas 200a, 200b, and 200c, and forming a single dielectric slab 206 relative to the respective multi-layer PCBs. For example, the respective multi-layer PCBs are exposed to a liquid state of the dielectric material and a dielectric slab is formed when the dielectric material transitions from a liquid state to a solid state. In other words, the dielectric slab 206 is formed around the respective multi-layer PCBs.

In some embodiments, formation of array 600 includes attaching respective multi-layer PCBs of microstrip antennas 200a, 200b, and 200c to a dielectric slab 206 using an adhesive or other mechanical restraint.

In some embodiments, transmission of RF waves by array 600 is controlled by a plurality of control elements (not shown). In some embodiments, a respective control element of the plurality of control elements includes one or more feeds. For example, a first control element controls first feed 224 and/or second feed 226. In some embodiments, a first control element causes microstrip antenna 200a to transmit a first RF signal, a second control element causes microstrip antenna 200b to transmit a second RF signal, and a third control element causes microstrip antenna 200c to transmit a third RF signal. In some embodiments, the first RF signal is transmitted with at least one characteristic that is distinct from a corresponding characteristic associated with the second RF signal and/or the third RF signal. In some embodiments, the control elements receive signals from processor(s) 104 of transmitter 102. For example, a control element includes an output terminal of processor(s) 104 and/or a communication channel from processor(s) 104 to a microstrip antenna 200.

Although a horizontal arrangement of microstrip antennas 200a, 200b, and 200c is shown in FIG. 6, it will be recognized that alternative arrangements may be used, such as a vertical arrangement of microstrip antennas 200 and/or a grid arrangement of microstrip antennas 200.

In some embodiments, multiple antenna arrays 600 may be included in a respective transmitter 102 and each of the multiple antenna arrays may be configured to transmit power waves at different frequencies (e.g., a first antenna array may be configured to transmit at 900 MHz and a second antenna array may be configured to transmit at 2.4 GHz). To allow for transmission at the different frequencies, each of the multiple antenna arrays may have antennas that are of different dimensions or shapes (e.g., the first antenna array may include larger antennas than the second antenna array).

FIGS. 7A-7C are a flowchart representation of a method 700 for forming an antenna, in accordance with some embodiments.

In some embodiments, forming an antenna optionally includes forming (702-a) a first multi-layer PCB 202 and forming (702-b) a second multi-layer PCB 204. In some embodiments, forming the first multi-layer PCB 202 includes printing a first electrically conductive layer on the top and bottom surfaces of the first multi-layer PCB (e.g., printing the electrically conductive layer as shown at top surface 210 and bottom surface 212 of first PCB 208, FIG. 2). In some embodiments, forming the second multi-layer PCB 204 includes printing the second electrically conductive layer on the top and bottom surfaces of the second multi-layer PCB (e.g., printing the electrically conductive layer as shown at top surface 216 and bottom surface 218 of second PCB 214, FIG. 2).

In some embodiments, forming a multi-layer PCB includes coupling an electrically conductive material (e.g., copper tape or other conductive material) to a substrate (e.g., PCB) by lamination (e.g., using an adhesive such as glue). In some embodiments, a multi-layer PCB is formed using a holding structure such as one or more notches and/or tabs such that an electrically conductive material is physically held in place relative to a substrate by the holding structure.

In some embodiments, forming the first multi-layer PCB 202 optionally includes depositing (704-a) a first heat-conductive material on an interior surface of at least a subset of the first plurality of vias 220. In some embodiments, forming the second multi-layer PCB 204 optionally includes depositing (704-b) a second heat-conductive material on an interior surface of at least a subset of the second plurality of vias 222. For example, a first heat-conductive material is deposited on an interior surface of one or more vias as shown at 502 and 504 of FIG. 5.

In some embodiments, depositing a first heat-conductive material on an interior surface of at least a subset of the first plurality of vias 220 includes depositing (706-a) the first heat-conductive material such that the first heat-conductive material (e.g., as shown at 502 and 504 of FIG. 5) is thermally coupled to the first electrically conductive material (e.g., as shown at 210 and 212 of FIG. 2) of the first multi-layer PCB 202. In some embodiments, depositing a second heat-conductive material on an interior surface of at least a subset of the second plurality of vias includes depositing (706-b) the second heat-conductive material such that the second heat-conductive material is thermally coupled to the second electrically conductive material (e.g., as shown at 216 and 218 of FIG. 2) of the second multi-layer PCB 204. In some embodiments, the heat-conducting material is a metal such as copper, aluminum, brass, steel, and/or bronze.

Turning now to FIG. 7B, in some embodiments, forming an antenna includes forming (708) a dielectric assembly by coupling a dielectric slab 206 to a first multi-layer PCB 202 and a second multi-layer PCB 204. The first multi-layer PCB 202 includes (708-a) a top surface and a bottom surface that is opposite the top surface. The top and bottom surfaces of the first multi-layer PCB 202 include a first electrically conductive material (e.g., as shown at 210 and 212 of FIG. 2). A first plurality of vias 220 each substantially pass through the top and bottom surfaces of the first multi-layer PCB 202. The second multi-layer PCB 204 includes (708-b) a top surface and a bottom surface that is opposite the top surface. The top and bottom surfaces of the second multi-layer PCT 204 include a second electrically conductive material (e.g., as shown at 216 and 218 of FIG. 2). A second plurality of vias 222 each substantially pass through the top and bottom surfaces of the second multi-layer PCB 204.

In some embodiments, dielectric slab 206 includes a dielectric material fabricated from an exotic and/or synthetic material, such as a material that has a high dielectric constant (e.g., a moldable ceramic). For example, in some embodiments, dielectric slab 206 has a dielectric constant between 1.0 and 40 (e.g., a dielectric constant of 30). In some embodiments, the dielectric slab 206 is formed from stone, ceramic, plastic, and/or glass, or gas (e.g., in a container). In some embodiments, dielectric slab 206 is fabricated from a material that is capable of insulating, reflecting, and/or absorbing electric current. In some embodiments, dielectric slab 206 is fabricated from one or more materials that are engineered to yield predetermined magnetic permeability and/or electrical permittivity values. In some embodiments, at least one of a magnetic permeability value or an electrical permittivity value of dielectric slab 206 is based upon at least one predetermined power-transfer requirement and/or compliance constraint (e.g., in compliance with one or more government regulations).

In some embodiments, coupling the dielectric slab 206 to the first multi-layer PCB 202 and the second multi-layer PCB 204 optionally includes (710) coupling the first multi-layer PCB 202 to the dielectric slab 206 using an adhesive (e.g., glue, epoxy, potting compound, or other suitable adhesive) and coupling the second multi-layer PCB 204 to the dielectric slab 206 using the adhesive.

In some embodiments, coupling the dielectric slab 206 to the first multi-layer PCB 202 and the second multi-layer PCB 204 optionally includes (712) arranging the first multi-layer PCB 202 and the second multi-layer PCB 204 relative to dielectric material while it is in a liquid state, wherein the first multi-layer PCB 202 and the second multi-layer PCB 204 have fixed positions within the dielectric slab 206 after the dielectric material of the dielectric slab 206 transitions from the liquid state to a solid state. For example, the dielectric material of dielectric slab 206 is a ceramic, plastic, or other state-changing material that is capable of transitioning from a liquid state to a set solid state. In some embodiments, the first multi-layer PCB 202 and the second multi-layer PCB 204 are coupled to the dielectric slab 206 by molding the dielectric material around the first multi-layer PCB 202 and the second multi-layer PCB 204. For example, the dielectric slab 206 is shaped to include two reservoirs that are configured to receive the first and second multi-layer PCBs and the dielectric slab 206 is then baked so that the first and second multi-layer PCBs are then securely attached within the respective reservoirs of the dielectric slab 206.

In some embodiments, forming an antenna includes coupling (714) at least one feed (e.g., first feed 224 and/or second feed 226) to the dielectric assembly (e.g., dielectric slab 206, first multi-layer PCB 202, and second multi-layer PCB 204). For example, the at least one feed is coupled to the dielectric assembly by inserting the at least one feed into the dielectric assembly (e.g., by drilling one or more holes at least partially through the dielectric slab 206, first multi-layer PCB 202, and second multi-layer PCB 204 and inserting the at least one feed into the one or more holes). In some embodiments, the at least one feed is coupled to the dielectric assembly by attaching the at least one feed to a surface of dielectric slab 206, first multi-layer PCB 202, and/or second multi-layer PCB 204 with adhesive or other coupling means.

In some embodiments, coupling the at least one feed to the dielectric assembly optionally includes inserting (716) the at least one feed into the dielectric assembly such that the at least one feed (e.g., first feed 224 and/or second feed 226) at least partially passes through at least one of: the first multi-layer PCB 202, the dielectric slab 206, or the second multi-layer PCB 204. For example, in FIG. 2, first feed 224 and second feed 226 are shown passing fully through second multi-layer PCB 204, passing fully through the dielectric slab 206, and passing partially through first multi-layer PCB 202.

In some embodiments, the at least one feed substantially (e.g., at least halfway) passes through (718) the first multi-layer PCB 202, the second multi-layer PCB 204, and the dielectric slab 206. For example, a feed substantially passes through a multi-layer PCB when the feed passes at least halfway from the bottom of the multi-layer PCB to the top of the multi-layer PCB.

In some embodiments, the first and second feeds are coupled to a power source and/or waveform generator (e.g., the power source and waveform generator described above in reference to FIG. 1) that provides a signal for transmission by an assembled antenna (e.g., microstrip antenna 200, FIG. 2).

The preceding description of the disclosed embodiments is provided to enable any person skilled in the art to make or use the embodiments described herein and variations thereof. Various modifications to these embodiments will be readily apparent to those skilled in the art, and the generic principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

Features of the present invention can be implemented in, using, or with the assistance of a computer program product, such as a storage medium (media) or computer readable storage medium (media) having instructions stored thereon/in which can be used to program a processing system to perform any of the features presented herein. The storage medium (e.g., memory 106) can include, but is not limited to, high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory (e.g., 106, 134, and/or 142) optionally includes one or more storage devices remotely located from the CPU(s) (e.g., processor(s) 104, 132, and/or 140). Memory (e.g., 106, 134, and/or 142), or alternatively the non-volatile memory device(s) within the memory, comprises a non-transitory computer readable storage medium.

Stored on any one of the machine readable medium (media), features of the present invention can be incorporated in software and/or firmware for controlling the hardware of a processing system (such as the components associated with the transmitters 102 and/or receivers 120), and for enabling a processing system to interact with other mechanisms utilizing the results of the present invention. Such software or firmware may include, but is not limited to, application code, device drivers, operating systems, and execution environments/containers.

Communication systems as referred to herein (e.g., communications components 112, 136, and/or 144) optionally communicate via wired and/or wireless communication connections. Communication systems optionally communicate with networks, such as the Internet, also referred to as the World Wide Web (WWW), an intranet and/or a wireless network, such as a cellular telephone network, a wireless local area network (LAN) and/or a metropolitan area network (MAN), and other devices by wireless communication. Wireless communication connections optionally use any of a plurality of communications standards, protocols and technologies, including but not limited to radio-frequency (RF), radio-frequency identification (RFID), infrared, radar, sound, Global System for Mobile Communications (GSM), Enhanced Data GSM Environment (EDGE), high-speed downlink packet access (HSDPA), high-speed uplink packet access (HSUPA), Evolution, Data-Only (EV-DO), HSPA, HSPA+, Dual-Cell HSPA (DC-HSPDA), long term evolution (LTE), near field communication (NFC), ZigBee, wideband code division multiple access (W-CDMA), code division multiple access (CDMA), time division multiple access (TDMA), Bluetooth, Wireless Fidelity (Wi-Fi) (e.g., IEEE 102.11a, IEEE 102.11ac, IEEE 102.11ax, IEEE 102.11b, IEEE 102.11g and/or IEEE 102.11n), voice over Internet Protocol (VoIP), Wi-MAX, a protocol for e-mail (e.g., Internet message access protocol (IMAP) and/or post office protocol (POP)), instant messaging (e.g., extensible messaging and presence protocol (XMPP), Session Initiation Protocol for Instant Messaging and Presence Leveraging Extensions (SIMPLE), Instant Messaging and Presence Service (IMPS)), and/or Short Message Service (SMS), or any other suitable communication protocol, including communication protocols not yet developed as of the filing date of this document.

It will be understood that, although the terms "first," "second," etc. may be used herein to describe various elements, these elements should not be limited by these terms. These terms are only used to distinguish one element from another.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. An antenna for use in a wireless power transmission system, the antenna comprising:
 a first multi-layer printed circuit board (PCB) that includes at least a first surface with a first electrically conductive material;
 a second multi-layer PCB that includes at least a second surface with a second electrically conductive material, wherein the second multi-layer PCB is separate and distinct from the first multi-layer PCB;
 a first plurality of vias that each substantially pass through the top and bottom surfaces of the first multi-layer PCB;
 a second plurality of vias that each substantially pass through the top and bottom surfaces of the second multi-layer PCB, wherein the second plurality of vias is separate and distinct from the first plurality of vias;
a dielectric slab that is configured to receive:
the first multi-layer PCB, and
the second multi-layer PCB; and
a first feed that (i) at least partially passes through each of the first multi-layer PCB, the second multi-layer PCB, and the dielectric slab, and (ii) contacts at least one via of the first plurality of vias and at least one via of the second plurality of vias, wherein the first feed delivers a radio frequency (RF) signal at a predetermined frequency to the antenna,
wherein the antenna is configured to transmit the RF signal for delivering wireless power to at least one remote receiver device, and the at least one remote receiver device is configured to convert the RF signal into usable power for providing power or charge to the at least one remote receiver device.

2. The antenna of claim 1, wherein a maximum cross-sectional dimension of the antenna is less than a wavelength corresponding to the predetermined frequency.

3. The antenna of claim 2, wherein a maximum cross-sectional dimension of the antenna is less than $1/10$ of the wavelength corresponding to the predetermined frequency.

4. The antenna of claim 3, wherein the maximum cross-sectional dimension of the antenna is less than $1/20$ of the wavelength corresponding to the predetermined frequency.

5. The antenna of claim 1, including a second feed that is coupled to the antenna, wherein the second feed is configured to provide an additional RF signal at the predetermined frequency to the antenna.

6. The antenna of claim 1, wherein a first diameter of at least a subset of vias of the first and second pluralities of vias corresponds to the predetermined frequency.

7. The antenna of claim 1, wherein a spacing between respective adjacent vias of the first and second pluralities of vias corresponds to the predetermined frequency.

8. The antenna of claim 1, wherein:
the wireless power transmission system includes a transmitter that includes:
a plurality of component antennas, wherein the antenna is a first component antenna of the plurality of component antennas; and
a plurality of control elements;
a first control element of the plurality of control elements is configured to cause the first component antenna to transmit a first RF signal; and
a second control element of the plurality of control elements is configured to cause a second component antenna of the plurality of component antennas to transmit a second RF signal, wherein the second RF signal is transmitted with at least one characteristic that is distinct from a corresponding characteristic associated with the first RF signal.

9. The antenna of claim 1, wherein a first heat-conductive material is coupled to an interior surface of at least one via of the first and second pluralities of vias.

10. The antenna of claim 9, wherein:
at least one of the first multi-layer PCB and the second multi-layer PCB includes a second heat-conductive material; and
the second heat-conductive material is thermally coupled to the first heat-conductive material that is coupled to the at least one via of the first and second pluralities of vias.

11. The antenna of claim 10, wherein the second heat-conductive material is included in at least one of the first electrically conductive material or the second electrically conductive material.

12. The antenna of claim 1, wherein the first and second multi-layer PCBs are secured to the dielectric slab at opposite ends of the dielectric slab.

13. A method for forming an antenna, comprising:
forming a dielectric assembly by coupling a dielectric slab to a first multi-layer printed circuit board (PCB) and a second multi-layer PCB, wherein the second multi-layer PCB is separate and distinct from the first multi-layer PCB, and wherein:
the first multi-layer PCB includes at least a first surface, wherein:
the first surface of the first multi-layer PCB includes a first electrically conductive material, and
a first plurality of vias each substantially pass through the first surface of the first multi-layer PCB; and
the second multi-layer PCB includes at least a second surface, wherein:
the second surface of the second multi-layer PCB includes a second electrically conductive material, and
a second plurality of vias that each substantially pass through the second surface of the second multi-layer PCB, wherein the second plurality of vias is separate and distinct from the first plurality of vias; and
coupling a first feed to the dielectric assembly, wherein the first feed (i) at least partially passes through each of the first multi-layer PCB, the dielectric slab, and the second multi-layer PCB, and (ii) contacts at least one via of the first plurality of vias and at least one via of the second plurality of vias, and further wherein the first feed delivers a radio frequency (RF) signal at a predetermined frequency to the antenna,
wherein the antenna is configured to transmit the RF signal for delivering wireless power to at least one remote receiver device, and the at least one remote receiver device is configured to convert the RF signal into usable power for providing power or charge to the at least one remote receiver device.

14. The method of claim 13, wherein coupling the dielectric slab to the first multi-layer PCB and the second multi-layer PCB includes:
coupling the first multi-layer PCB to the dielectric slab using an adhesive; and
coupling the second multi-layer PCB to the dielectric slab using the adhesive.

15. The method of claim 13, wherein coupling the dielectric slab to the first multi-layer PCB and the second multi-layer PCB includes:
arranging the first multi-layer PCB and the second multi-layer PCB relative to a dielectric material while it is in a liquid state, wherein the first multi-layer PCB and the second multi-layer PCB have fixed positions within the dielectric slab after the dielectric material of the dielectric slab transitions from the liquid state to a solid state.

16. The method of claim 13, including:
forming the first multi-layer PCB, wherein forming the first multi-layer PCB includes printing the first electrically conductive layer on the first surface of the first multi-layer PCB, and
forming the second multi-layer PCB, wherein forming the second multi-layer PCB includes printing the second electrically conductive layer on the second surface of the second multi-layer PCB.

17. The method of claim 13, including:
forming the first multi-layer PCB includes depositing a first heat-conductive material on an interior surface of at least a subset of the first plurality of vias, and
forming the second multi-layer PCB includes depositing a second heat-conductive material on an interior surface of at least a subset of the second plurality of vias.

18. The method of claim 17, wherein:
depositing a first heat-conductive material on an interior surface of at least a subset of the first plurality of vias includes depositing the first heat-conductive material such that the first heat-conductive material is thermally coupled to the first electrically conductive material of the first multi-layer PCB; and
depositing a second heat-conductive material on an interior surface of at least a subset of the second plurality of vias includes depositing the second heat-conductive material such that the second heat-conductive material is thermally coupled to the second electrically conductive material of the second multi-layer PCB.

\* \* \* \* \*